(12) United States Patent
Wang

(10) Patent No.: US 7,759,719 B2
(45) Date of Patent: Jul. 20, 2010

(54) ELECTRICALLY ALTERABLE MEMORY CELL

(76) Inventor: Chih-Hsin Wang, 6585 Gillis Dr., San Jose, CA (US) 95120

( * ) Notice: Subject to any disclaimer, the term of this patent is extended or adjusted under 35 U.S.C. 154(b) by 1202 days.

(21) Appl. No.: 11/120,691

(22) Filed: May 2, 2005

(65) Prior Publication Data

US 2006/0006454 A1 Jan. 12, 2006

Related U.S. Application Data

(60) Provisional application No. 60/585,238, filed on Jul. 1, 2004.

(51) Int. Cl.
*H01L 29/786* (2006.01)
(52) U.S. Cl. .................... 257/314; 257/315; 257/316; 257/E29.129
(58) Field of Classification Search .......... 257/E29.303, 257/E29.305, E29.306, E29.309, 314–316, 257/319, 320, 324, 29
See application file for complete search history.

(56) References Cited

U.S. PATENT DOCUMENTS

| | | | |
|---|---|---|---|
| 3,943,543 A | 3/1976 | Caywood | |
| 3,944,849 A | 3/1976 | Tasch, Jr. et al. | |
| 4,072,977 A | 2/1978 | Bate et al. | |
| 4,462,090 A | 7/1984 | Iizuka et al. | |
| 4,698,787 A | 10/1987 | Mukherjee et al. | |
| 4,957,877 A | 9/1990 | Tam et al. | |
| 5,029,130 A | 7/1991 | Yeh | |
| 5,053,839 A | 10/1991 | Esquivel et al. | |
| 5,070,480 A | 12/1991 | Caywood | |
| 5,095,344 A | 3/1992 | Harari | |
| 5,115,289 A | 5/1992 | Hisamoto et al. | |
| 5,146,426 A | 9/1992 | Mukherjee et al. | |
| 5,153,880 A | 10/1992 | Owen et al. | |
| 5,161,157 A | 11/1992 | Owen et al. | |
| 5,235,544 A | 8/1993 | Caywood | |
| 5,268,319 A | 12/1993 | Harari | |
| 5,270,980 A | 12/1993 | Pathak et al. | |
| 5,280,446 A | 1/1994 | Ma et al. | |
| 5,286,994 A | 2/1994 | Ozawa et al. | |
| 5,426,316 A | 6/1995 | Mohammad | |
| 5,429,965 A | 7/1995 | Shimoji | |
| 5,432,739 A | 7/1995 | Pein | |
| 5,517,044 A | 5/1996 | Koyama et al. | |
| 5,523,243 A | 6/1996 | Mohammad | |
| 5,557,122 A | 9/1996 | Shrivastava et al. | |
| 5,559,735 A | 9/1996 | Ono et al. | |
| 5,563,083 A | 10/1996 | Pein | |
| 5,621,738 A | 4/1997 | Caywood et al. | |
| 5,714,766 A | 2/1998 | Chen et al. | |
| 5,739,567 A | 4/1998 | Lipp et al. | |
| 5,764,096 A | 6/1998 | Lipp et al. | |
| 5,768,192 A | 6/1998 | Eitan | |

(Continued)

OTHER PUBLICATIONS

Bock et al; "3.3ps SiGe Bipolar Technology," Proceeding of the IEDM, pp. 255-258; 2004.

(Continued)

*Primary Examiner*—Eugene Lee

(57) ABSTRACT

A nonvolatile memory cell is provided. The cell has a charge filter, a tunneling gate, a ballistic gate, a charge storage layer, a source, and a drain with a channel defined between the source and drain. The charge filter permits transporting of charge carriers of one polarity type from the tunneling gate through the blocking material and the ballistic gate to the charge storage layer while blocking the transport of charge carriers of an opposite polarity from the ballistic gate to the tunneling gate. Further embodiments of the present invention provide a cell having a charge filter, a supplier gate, a tunneling gate, a ballistic gate, a source, a drain, a channel, and a charge storage layer. The present invention further provides an energy band engineering method permitting the memory cell be operated without suffering from disturbs, from dielectric breakdown, from impact ionization, and from undesirable RC effects.

9 Claims, 17 Drawing Sheets

U.S. PATENT DOCUMENTS

| | | | |
|---|---|---|---|
| 5,780,341 A | 7/1998 | Ogura | |
| 5,790,455 A | 8/1998 | Caywood | |
| 5,792,670 A | 8/1998 | Pio et al. | |
| 5,822,242 A | 10/1998 | Chen | |
| 5,838,039 A | 11/1998 | Sato et al. | |
| 5,847,427 A | 12/1998 | Hagiwara | |
| 5,847,996 A | 12/1998 | Guterman et al. | |
| 5,883,409 A | 3/1999 | Guterman et al. | |
| 5,966,329 A | 10/1999 | Hsu et al. | |
| 5,973,356 A | 10/1999 | Noble et al. | |
| 6,002,152 A | 12/1999 | Guterman et al. | |
| 6,080,995 A | 6/2000 | Nomoto | |
| 6,088,263 A | 7/2000 | Liu et al. | |
| 6,091,104 A | 7/2000 | Chen | |
| 6,103,573 A | 8/2000 | Harari | |
| 6,104,057 A | 8/2000 | Nakanishi et al. | |
| 6,201,732 B1 | 3/2001 | Caywood | |
| 6,211,562 B1 | 4/2001 | Forbes et al. | |
| 6,303,940 B1 | 10/2001 | Kizilyalli et al. | |
| 6,313,487 B1 | 11/2001 | Kencke et al. | |
| 6,368,915 B1 | 4/2002 | Kitamura et al. | |
| 6,372,617 B1 | 4/2002 | Kitamura | |
| 6,384,451 B1 | 5/2002 | Caywood | |
| 6,388,922 B1 | 5/2002 | Fujiwara et al. | |
| 6,407,424 B2 | 6/2002 | Forbes | |
| 6,411,545 B1 | 6/2002 | Caywood | |
| 6,426,896 B1 | 7/2002 | Chen | |
| 6,449,189 B2 | 9/2002 | Mihnea et al. | |
| 6,451,652 B1 | 9/2002 | Caywood | |
| 6,469,343 B1 | 10/2002 | Mura et al. | |
| 6,479,863 B2 | 11/2002 | Caywood | |
| 6,503,785 B2 | 1/2003 | Chen | |
| 6,525,371 B2 | 2/2003 | Johnson | |
| 6,525,962 B1 | 2/2003 | Pai et al. | |
| 6,531,731 B2 | 3/2003 | Jones et al. | |
| 6,534,816 B1 | 3/2003 | Caywood | |
| 6,555,865 B2 | 4/2003 | Lee | |
| 6,566,706 B1 | 5/2003 | Wang et al. | |
| 6,574,140 B2 | 6/2003 | Caywood | |
| 6,580,124 B1 | 6/2003 | Cleeves et al. | |
| 6,580,642 B1 | 6/2003 | Wang | |
| 6,593,624 B2 | 7/2003 | Walker | |
| 6,621,107 B2 | 9/2003 | Blanchard et al. | |
| 6,680,505 B2 | 1/2004 | Ohba et al. | |
| 6,709,928 B1 | 3/2004 | Jenne et al. | |
| 6,721,205 B2 | 4/2004 | Kobayashi et al. | |
| 6,727,545 B2 | 4/2004 | Wang et al. | |
| 6,734,105 B2 | 5/2004 | Kim | |
| 6,743,674 B2 | 6/2004 | Wang | |
| 6,744,111 B1 | 6/2004 | Wu | |
| 6,745,370 B1 | 6/2004 | Segal et al. | |
| 6,747,310 B2 | 6/2004 | Fan | |
| 6,753,568 B1 | 6/2004 | Nakazato et al. | |
| 6,756,633 B2 | 6/2004 | Wang et al. | |
| 6,774,433 B2 | 8/2004 | Lee et al. | |
| 6,790,727 B2 | 9/2004 | Jones et al. | |
| 6,791,883 B2 | 9/2004 | Swift et al. | |
| 6,815,764 B2 | 11/2004 | Bae et al. | |
| 6,847,556 B2 | 1/2005 | Cho | |
| 6,853,583 B2 | 2/2005 | Diorio et al. | |
| 6,861,698 B2 | 3/2005 | Wang | |
| 6,873,006 B2 | 3/2005 | Chen et al. | |
| 6,882,572 B2 | 4/2005 | Wang et al. | |
| 6,894,339 B2 | 5/2005 | Fan et al. | |
| 6,894,343 B2 | 5/2005 | Harari et al. | |
| 6,897,514 B2 | 5/2005 | Kouznetsov et al. | |
| 6,936,884 B2 * | 8/2005 | Chae et al. | 257/315 |
| 6,936,887 B2 | 8/2005 | Harari et al. | |
| 6,952,032 B2 | 10/2005 | Forbes et al. | |
| 6,952,033 B2 | 10/2005 | Kianian et al. | |
| 6,953,970 B2 | 10/2005 | Yuan et al. | |
| 6,958,513 B2 | 10/2005 | Wang | |
| 7,015,102 B2 | 3/2006 | Wang | |
| 7,018,897 B2 | 3/2006 | Wang | |
| 7,074,672 B2 | 7/2006 | Kianian et al. | |
| 7,075,823 B2 | 7/2006 | Harari | |
| 7,115,942 B2 | 10/2006 | Wang | |
| 7,149,118 B2 | 12/2006 | Diorio et al. | |
| 7,190,018 B2 | 3/2007 | Chen et al. | |
| 7,259,984 B2 | 8/2007 | Kan et al. | |
| 7,307,308 B2 | 12/2007 | Lee et al. | |
| 2001/0029077 A1 | 10/2001 | Noble et al. | |
| 2002/0179958 A1 | 12/2002 | Kim | |
| 2004/0021170 A1 | 2/2004 | Caywood | |
| 2004/0160824 A1 | 8/2004 | Kianian et al. | |
| 2004/0214396 A1 | 10/2004 | Wang et al. | |
| 2005/0167734 A1 * | 8/2005 | She et al. | 257/321 |
| 2005/0247972 A1 | 11/2005 | Forbes | |
| 2006/0284236 A1 | 12/2006 | Bhattacharyya | |

OTHER PUBLICATIONS

Caywood, John M. et al; "A Novel Nonvolatile Memory Cell Suitable for Both Flash and Byte-Writable Applications"; IEEE Transactions on Electron Devices, vol. 49, No. 5, May 2002; pp. 802-807.

Fischetti et al; "Six-band k.p calculation of hole mobility in silicon inversion layers: dependence on surface . . . ," Journal of Appl. Physics, vol. 94, pp. 1079-1095; 2003.

Hensel et al; "Cyclotron Resonance Experiments in Uniaxially Stressed Silicon; Valence Band Inverse Mass Parameters and Deformation . . . ," Phys. Rev. 129, pp. 1141-1062; 1963.

Hinckley et al; "Hole Transport Theory in Pseudomorphic Si1-xGex Allows Grown on Si(001) Substrates," Phys. Rev. B, 41, pp. 2912-2926; 1990.

Kitamura et al; "A Low Voltage Operating Flash Cell with High Coupling Ratio Using Horned Floating Gate with Fine HSG"; 1998 Symposium on FLSI Technology Digest of Technical Papers; pp. 104-105.

Kuo et al; "FEFET—A High Density, Low Erase Voltage, Trench Flash EEPROM"; 1994 Symposium on VLSI Technology Digest of Technigal Papers; pp. 51-52.

Lai, Stefan; "Flash Memories: Where We Were and Where We Are Going"; 1998 IEEE; pp. 971-973.

Lenzlinger and Snow; Fowler-Nordheim Tunneling into Thermally Grown SiO2; J. Appl. Phys. vol. 40, No. 1; Jan. 1969; pp. 278-283.

M. Heiblum et al; "Direct Observation of ballistic Transport in GaAs," pp. 2200-2203, vol. 55, Physical Review Letters; 1985.

Nicoilian and Brews; "MOS Physics and Technology," Wiley-Interscience, 1982, "Photo I-V method—Basics"; pp. 512-515.

S. Sze; "Physics of Semiconductor Devices"; Wiley-Interscience, 1981, "Schotky Effect", pp. 250-253.

SMA5111—Compound Semiconductors; Lecture 2—Metal-Semiconductor Junctions-Outline; C. G. Fonstad; Feb. 2003; 22 pages.

Vogelsang et al; "Electron Mobilities and High-Field Drift Velocity in Strained Silicon on Silicon-Germanium Substrate", IEEE Trans. on Electron Devices, pp. 2641-2642; 1992.

Wang, Chih Hsin; "Three-Dimensional DIBL for Shallow-Trench Isolated MOSFET's"; IEEE Transactions on Electron Devices, vol. 46, No. 1, Jan. 1999; pp. 139-144.

C. A. Mead, "The Tunnel-Emission Amplifier", Proceedings of the IRE, pp. 359-361, 1960.

H. Fujiwara et al, "High-Efficiency Programming with Inter-Gate Hot-Electron Injection for Flash . . . ," Digest of Non-Volatile Semiconductor Memory Workshop, p. 127, Feb. 2000.

First Examination Report from the State Intellectual Property Office of the People's Republic of China dated Aug. 30, 2007 for Chinese Application No. 2005/100804259; 9 pages.

First Examination Report from the State Intellectual Property Office of the People's Republic of China dated Sep. 6, 2007 for Chinese Application No. 2005/100804314; 8 pages.

Pein, H. et al.; "Performance of the 3-D Sidewall Flash EPROM Cell", IEDM Technical Digest, pp. 11-14, Dec. 1993.

* cited by examiner

ELECTRICALLY ALTERABLE MEMORY CELL

RELATED APPLICATIONS

This application claims the benefit of U.S. Provisional Application No. 60/585,238, filed Jul. 1, 2004.

TECHNICAL FIELD

The present invention deals with nonvolatile memory, and relates more specifically to Electrically Programmable Read Only Memories (EPROM) and Electrically Erasable and Programmable Read Only Memories (EEPROM). More particularly, the present invention relates to memory cell structure and method altering barrier heights of ballistic-charge filter for memory cell operations.

BACKGROUND OF THE INVENTION

Non-volatile semiconductor memory cells permitting charge storage capability are well known in the art. The charges are typically stored in a floating gate to define the states of a memory cell. Typically, the states can be either two levels or more than two levels (for multi-level states storage). Mechanisms such as channel hot electron (CHE), source-side injection (SSI), Fowler-Nordheim tunneling (FN), and Band-to-Band Tunneling (BTBT) can be used to alter the states of such cells in program and/or erase operations.

Ballistic transport of charge carriers is a well-known phenomenon in solid state physics and can be another mechanism for cell operations. Ballistic transport represents charge carriers transporting in an active layer of conductive material (e.g. a semiconductor crystal) without scattering at all (i.e. transporting in a "ballistic" way). The active layer has to be kept thin enough to permit carrier transmission with substantially no scattering. Under these conditions, the transport of carriers resembles that in vacuum, but with the effective mass and group velocity of the carriers in the conductive material. One application of such physics has been proposed in a three terminals device (or "transistor") in an article by Mead (see Mead, "The Tunnel Emission Amplifier," Proceedings of the IRE, vol. 48, pp. 359-361, 1960), wherein a tunneling structure having symmetrical energy band structure is proposed. However, there are several fundamental problems associated with the energy band structure of transistor in the noted article when employed for the ballistic transport mechanism. Further, there are fundamental problems when such mechanism and band structure are considered for non-volatile memory operation.

The present invention solves these problems by providing a barrier height engineering concept on energy band structure, by providing a novel method altering barrier heights, by providing charge filter structures, and by providing new memory cell structures.

DISCLOSURE OF THE INVENTION

It is the object of the invention to provide an electrically alterable memory cell.

Briefly, a preferred embodiment of the present invention is a nonvolatile memory cell. A body of a semiconductor material is provided having a first conductivity type. A first and a second region of a second conductivity type are formed in the body, and between them create a channel region in the body. A charge storage layer is disposed over and insulated from the channel region, a ballistic gate is disposed over and insulated from the charge storage layer, and a tunneling gate is disposed over and insulated from the ballistic gate by a charge filter. The charge filter permits transporting of charge carriers of one polarity type from the tunneling gate through the ballistic gate to the charge storage layer and blocks transporting of charge carriers of an opposite polarity from the ballistic gate to the tunneling gate.

Briefly, another preferred embodiment of the present invention is a nonvolatile memory cell. A body of a semiconductor material is provided having a first conductivity type. A first and a second region of a second conductivity type are formed in the body, and between them create a channel region in the body. A charge storage layer is disposed over and insulated from the channel region. A ballistic gate and a supplier gate are further provided, next to each other and insulated from the charge storage layer, with the supplier gate being of a second semiconductor material and having an energy band gap and impurity concentration different from the ballistic gate. A tunneling gate is then disposed over and insulated from the uppermost of the ballistic gate and the supplier gate by a charge filter.

Summary On Advantages Of The Present Invention:

1) The present invention addresses parasitic charges issue.

The cells provided in the present invention illustrate that the requirement on a large work function for the ballistic gate, as required for minimizing parasitic charges, is not necessary. Further, the cell structures of the present invention remove the requirement on maintaining a similar current level for the forward and the backward tunneling carriers. The backward tunneling current can be reduced by the filter to fix the current waste problem;

2) The present invention provides the filter structure permitting thicker dielectrics be used in the cell. A thicker dielectric has the advantage on manufacturing control, thus the memory cell of the present invention is more manufacturable than cells without the filter structure;

3) The present invention permits erase operation without suffering dielectric breakdown problem;

4) The present invention avoids impact ionization in ballistic gate and in tunneling gate;

5) The present invention permits cell operation without cell disturb, and provide cell structure more effective on cell disturb prevention in un-selected cells;

6) The present invention suppresses large R effect and permits lower sheet-resistance polysilicon (i.e. n-type poly) for ballistic gate and tunneling gate, made possible by removing the restriction on material selection (e.g. p-type polysilicon) for ballistic gate or by providing an unique energy band architecture on supply gate and ballistic gate in cells of present invention; and 7) The present invention suppresses large C effect;

These and other objects and advantages of the present invention will become clear to those skilled in the art in view of the description of the preferred embodiment as described herein and as illustrated in the figures of the drawings.

BRIEF DESCRIPTION OF THE DRAWINGS

The invention is herein described, by ways of example only, with reference to accompanying drawings, wherein.

DETAILED DESCRIPTION OF THE INVENTION

The present invention provides nonvolatile memory cells having filter structures. A novel method altering barrier heights of the filters is further provided for operating the cells of the present invention. The present invention further provides barrier height engineering concept on energy band structure for designing the filter structures.

The Memory Cell of the Present Invention

Embodiment 100

As used herein, the symbol n+ indicates a heavily doped n-type semiconductor material typically having a doping level of n-type impurities (e.g. arsenic) on the order of $10^{20}$ atoms/cm$^3$. The symbol p+ indicates a heavily doped p-type semiconductor material typically having a doping level of p-type impurities (e.g. boron) on the order of $10^{20}$ atoms/cm$^3$.

Figure 1A:
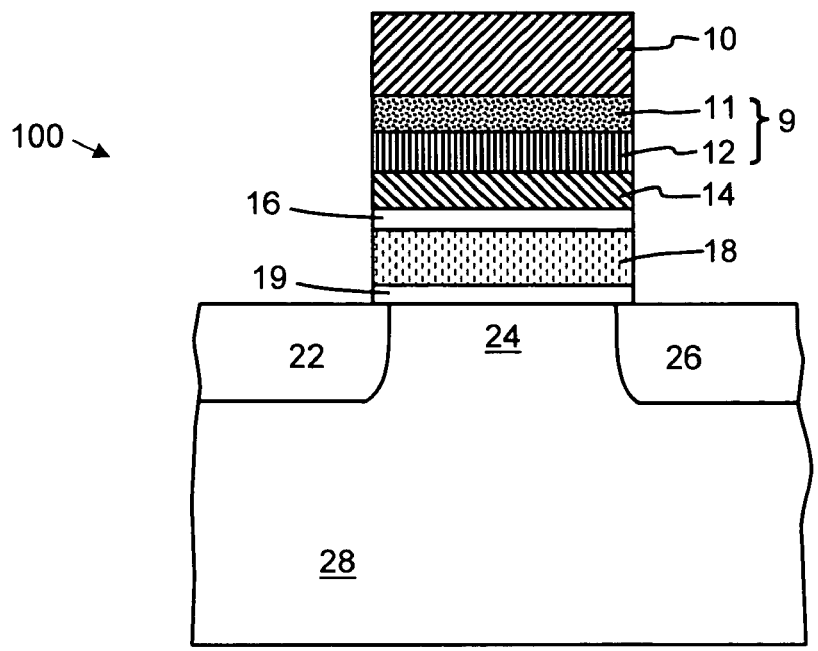
FIG. 1A illustrates a cross sectional view on a cell architecture of the present invention.

FIG. 1A shows a cross-sectional view of cell architecture 100 in accordance with one embodiment of the present invention. There is shown a tunneling gate (TG 10), a filter 9, a ballistic gate (BG 14), a floating gate (FG 18), a source 22, a channel 24, a drain 26, and a body 28 in a semiconductor substrate (such as a silicon substrate or a silicon-on-insulator substrate). The filter 9 comprises a tunneling dielectric (TD 11) and a blocking dielectric (BD 12). The TD 11 is sandwiched in between the TG 10 and the BD 12 regions. Likewise, the BD 12 is sandwiched in between the TD 11 and the BG 14 regions. The BG 14 is disposed adjacent to and insulated from the FG 18 by a retention dielectric (RD 16). The body 28 can be a semiconductor material of a first conductivity type (e.g. p-type) having doping level in the range of about $1 \times 10^{15}$ atoms/cm$^3$ to about $1 \times 10^{18}$ atoms/cm$^3$. The source 22 and drain 26 are formed in the body with the channel 24 of the body defined therebetween, and are typically heavily doped by impurity of a second conductivity type (e.g. n-type) having doping level in the range of about $1 \times 10^{18}$ atoms/cm$^3$ to about $5 \times 10^{21}$ atoms/cm$^3$. The FG 18 is disposed over and insulated from the body 28 by a channel dielectric 19. The RD 16 is typically a thick layer of dielectric having large barrier heights to retain charges on the FG 18 without leaking. The TG 10 overlaps the BG 14 to form an overlap portion between the two, where at least a portion of FG 18 is disposed thereunder. The overlap portion is essential in the cell structure as charge carriers are filtered through that portion in order to be transported through BG 14, RD 16 and finally into the FG 18. The FG 18 is for storing such charge carriers and can be polycrystalline silicon ("polysilicon").

The BG 14 can be a heavily doped semiconductor such as polysilicon and polycrystalline Silicon-Germanium ("poly SiGe"), low resistivity interconnect material such as metalized silicon ("silicide"), a refractory metal, or nitride-metal compound such as tantalum nitride (TaN). As will be described in detail hereinafter, material for BG 14 with a large work function (e.g. heavily doped p-type polysilicon ("p+ polysilicon"), platinum etc.) is not necessary be the criteria in the present invention in order to suppress parasitic electrons emitted from BG 14. TG 10 is desirable to have a work function such that it can supply electrons during program and holes during erase, and typically can be a heavily doped polysilicon, poly SiGe, low resistivity interconnect material such as silicide, or a refractory metal, with a thickness in the range of about 20 nm to 400 nm. The TD 11 is constructed as a single layer of dielectric material such as oxide, nitride, oxynitride, aluminum oxide (Al$_2$O$_3$), hafnium oxide (HfO$_2$), zirconium oxide (ZrO$_2$) or an alloy of these materials, and has a thickness in the range of about 1.5 nm to about 4 nm. The BD 12 of filter 9 can be typically constructed as a single layer of dielectric material having a narrower energy band gap than that of TD 11, and can be selected from the group of oxynitride, nitride, aluminum oxide, hafnium oxide, zirconium oxide and alloys of these materials. The BD 12 can have a thickness in the range of about 1 nm to about 6 nm, and can have a similar or higher dielectric constant than the TD 11.

One specific embodiment on cell 100 illustrated in the present invention comprises a p+ polysilicon for the TG 10, an oxide layer for the TD 11, a nitride layer for the BD 12, and a heavily doped n-type polysilicon ("n+ polysilicon") for the BG 14. The n+ polysilicon is considered for BG 14 due to several considerations. A major consideration lies in the much higher solid solubility for n-type impurities (e.g. Arsenic, phosphorous etc) than that for p-type impurities (e.g. Boron). Impurity with a higher solid solubility is desirable as it usually can dope the silicon heavier to result in a lower sheet resistance, and is favorable for integrated circuits ("IC") application. In the embodiment, polysilicon is employed as the material for TG 10 and BG 14 due to its well proven yieldability, manufacturability, and compatibility with state of the art IC technology. An oxide with a thickness of about 5 nm to 11 nm is employed for the RD 16 due to the same reason. The oxide layer used for TD 11 can be with a thickness in the range of about 20 Å to 35 Å (or 2 nm to 3.5 nm in unit of nanometer "nm"). The thickness of TD 11 layer is chosen in the range where charge-carriers (electrons or holes) transporting across the layer are primarily through the direct tunneling mechanism. The thickness of BD 12 is chosen to block charge-carriers (electrons or holes) from tunneling through the filter 9 (i.e. through both TD 11 and BD 12 layers) when a modest voltage in the range of about 1 V to about 2.5V is applied between TG 10 and BG 14. The thickness of BD 12 is further chosen to permit one type of charge carriers (e.g. holes) transporting in a forward direction (i.e. from TG 10 to BG 14) and to block the other type of charge carriers (e.g. electrons) from transporting in a backward direction (i.e. from BG 14 to TG 10) when in a higher voltage range (3V or higher) is applied between TG 10 and BG 14. As will be described in the barrier height engineering theory hereinafter, the selection on thickness of BD 12 is also determined by the dielectric constant of BD 12. In general, the thickness of BD 12 can be thinner or thicker than that of TD 11 provided the tunneling stack of TD 11 and BD 12 can effectively meet the forgoing requirements. For example, in the specific embodiment, if an oxide with 30 Å is chosen for TD 11, then the minimum thickness for BD 12 can be about 20 Å or thicker. For the specific embodiment, the oxide for TD 11 can be a HTO (high temperature oxide) or a TEOS layer formed by using conventional deposition technique, or a thermal oxide by using thermal oxidation technique well-known in the art. The nitride for BD 12 can be formed by Rapid Thermal Nitridation ("RTN") in NH3 ambient at a high temperature (e.g. 1050° C.).

Figure 1B:
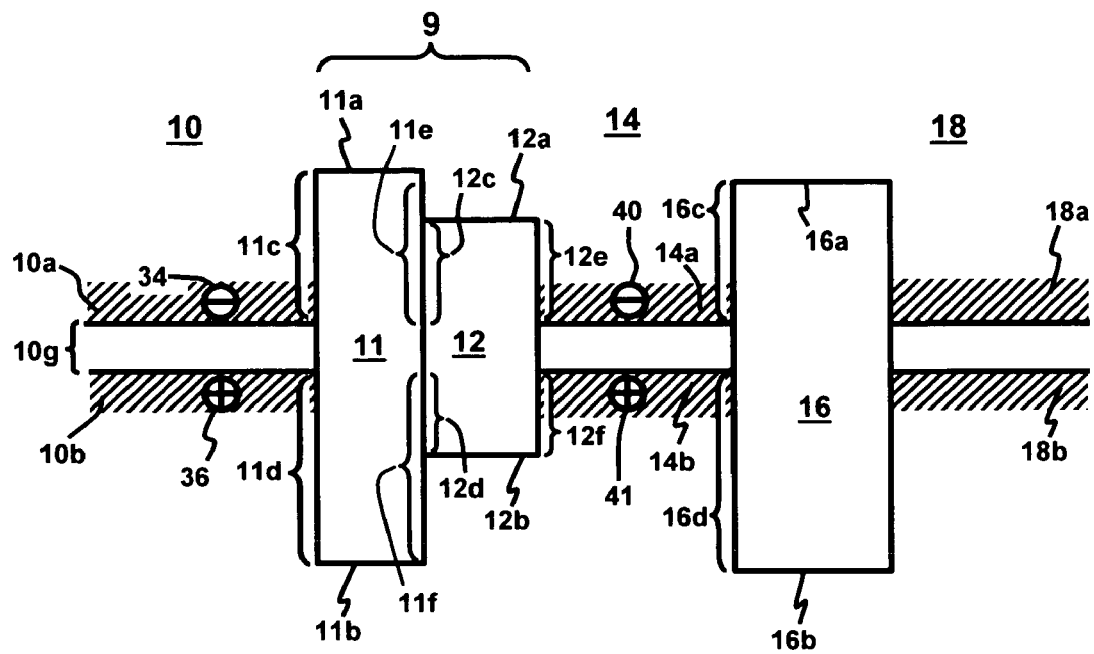
FIG. 1B is the energy band diagram of the structure of FIG. 1A, illustrating various barrier heights under the flat-band condition.

FIG. 1B is an energy band diagram in the flat-band condition for materials along regions from TG 10 to FG 18 in cell structure 100. There are shown conduction bands 10a, 11a, 12a, 14a, 16a, and 18a for TG 10, TD11, BD 12, BG 14, RD 16, and FG 18, respectively. Similarly, there are shown valence bands 10b, 11b, 12b, 14b, 16b, and 18b for TG 10, TD11, BD 12, BG 14, RD 16, and FG 18, respectively. The conduction band 10a and valence band 10b of TG 10 is shown separated in energy by an energy gap 10g of TG 10. In the filter region 9, there are shown a conduction band offset 11c ($\Delta\Phi_{CB\_TT}$) between TG 10 and TD 11, a valence band offset 11d ($\Delta\Phi_{VB\_TT}$) between TG 10 and TD 11, a conduction band offset 11e ($\Delta\Phi_{CB\_GT}$) between BG 14 and TD 11, a valence band offset 11f ($\Delta\Phi_{VB\_GT}$) between BG 14 and TD 11. Further, there are shown a conduction band offset 12c ($\Delta\Phi_{CB\_TB}$) between TG 10 and BD 12, a valence band offset 12d ($\Delta\Phi_{VB\_TB}$) between TG 10 and BD 12, a conduction band offset 12e ($\Delta\Phi_{CB\_GB}$) between BG 14 and BD 12, and a valence band offset 12f ($\Delta\Phi_{VB\_GB}$) between BG 14 and BD 12. The alteration on these band offsets provides a filtering mechanism in the filter 9. In TG 10, there are shown conduction electrons (CE 34) and holes 36 in TG conduction band 10a and valence band 10b, respectively. Similarly, in BG 14, there are shown conduction electrons (CE 40) and holes 41 in conduction band 14a and valence band 14b of BG 14, respectively. Though not shown, electrons can also in presence in the valence bands 10b and 14b, and are termed as valence electrons (VE) 42 and 44 in TG 10 and BG 14, respectively. In the RD 16 region, there are shown a conduction band offset 16c ($\Delta\Phi_{CB\_GR}$) between BG 14 and RD 16, and a valence band offset 16d ($\Delta\Phi_{VB\_GR}$) between BG 14 and RD 16.

There are several considerations were taken into account in selecting the material for TD 11 and BD 12 of filter 9 of cell 100. These considerations can be better captured by briefly referring to FIG. 1B. First, the materials are chosen to have the conduction band offset 11c ($\Delta\Phi_{CB\_TT}$) between TG 10 and TD 11 be greater than the conduction band offset 12c ($\Delta\Phi_{CB\_TB}$) between TG 10 and BD 12. In addition, the materials are chosen to have the valence band offset 11d ($\Delta\Phi_{VB\_TT}$) between TG 10 and TD 11 be greater than the valence band offset 12d ($\Delta\Phi_{VB\_TB}$) between TG 10 and BD 12. Therefore, the materials are chosen such that the energy gap for TD 11 is larger than that for the BD 12. Furthermore, the materials for TD 11 and BD 12 should be high quality dielectrics permitting charge carriers to transport therethrough from one side of the dielectric to the other in quantum mechanical tunneling mechanisms (such as direct tunneling or Fowler Nordheim tunneling well-known in the art). Finally, as a default and an absolute requirement, the material for TD 11 and BD 12 should be compatible with semiconductor technology. The thickness of TD 11 is desired to be thin enough to permit direct tunneling of charges therethrough. The thickness of BD 12 layer is chosen such that filter 9 can block charge carriers (either electrons or holes) tunneling therethrough along direction from BG 14 to TG 10. Different from the prior art energy band in the noted article, the tunneling structure of the present invention is composed of TG/TD/BD/BG 10/11/12/14 and is constructed in an asymmetrical structure form on the energy band diagram. The asymmetrical structure is important as it provides unique features on selectively tunneling one type of charge carriers (e.g. holes) along a forward direction (i.e. from TG 10 to BG 14) while blocking the opposite type (e.g. electrons) from backward tunneling (i.e. from BG 14 to TG 10). As will be described below, the thickness and physical properties of the BD 12 and TD 11 can be separately optimized for the tunneling injection (e.g. suppressing the backward tunneling of parasitic charges) and for the parasitic capacitance between TG 10 and BG 14.

With the BD 12 of filter 9 thus considered, the conduction band offset 12e is provided in FIG. 1B to form an effective barrier preventing conduction electrons CE 40 in BG 14 region from backward tunneling through filter 9 into the TG 10. Likewise, the valence band offset 12f is provided to form an effective barrier preventing holes 41 in BG 14 region from backward tunneling through BD 12 into the TG 10 region. Furthermore, the conduction band offset 12c provided in FIG. 1B forms an effective barrier preventing CE 34 in TG 10 region from forward tunneling through BD 12 into the BG 14 region. Likewise, the valence band offset 12d is provided to form an effective barrier preventing holes 36 in TG 10 region from forward tunneling through BD 12 into the BG 14 region.

The blocking mechanism provided herein is illustrated in FIG. 1B for energy band in the flat-band condition, where there is no electric field across the TD and BD dielectrics. The blocking mechanism stays effective through out the bias range as the modest voltage appear across TD and BD dielectrics. The blocking mechanism in higher voltage range is somewhat different than that in the modest voltage range and is illustrated next for program and for erase operations with reference to the bias polarity and voltage range of each of these operations.

Barrier Heights Engineering for Programming the Memory Cell

Figure 2A:
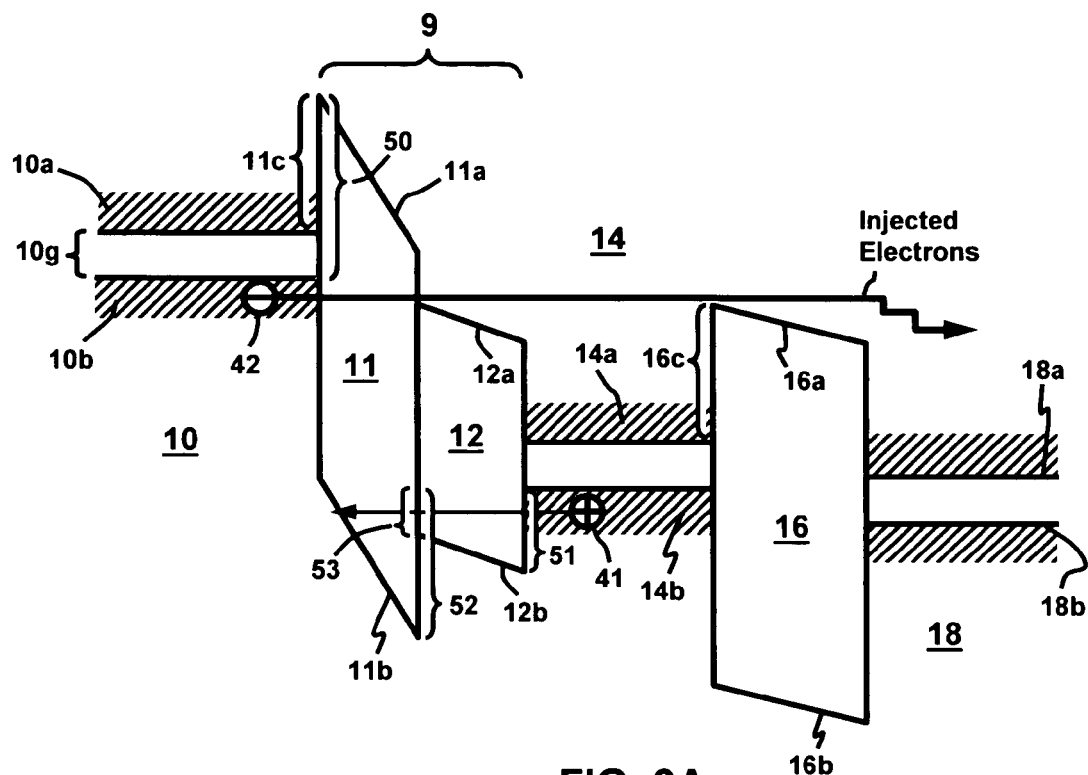
FIG. 2A is the energy band diagram of the structure of FIG. 1A, illustrating various barrier heights under the program condition, and further illustrating the barrier heights and the trapezoidal barrier structure for blocking the hole carriers from backward tunneling.

Please refer to the energy band diagram in FIG. 2A for the program operation of cell 100. There is shown the energy band diagram along regions from TG 10 to FG 18 in cell structure 100 when TG 10 is negatively biased with respect to the BG 14 by a program voltage (e.g. in the range of about $-3$ V to about $-5V$). Further, there is shown electrons 42 transporting through the filter 9, the BG 14, the RD 16, and finally be collected and stored on FG 18. The potential of FG 18 is shown positive with respect to the BG 14 potential by about 0.75 V to about 2V. An example on voltages applied to each region is: $-2V$ applied to TG 10, $+2V$ applied to BG 14, and $+3V$ applied to the source 22 and drain 26. The energy band diagram is illustrated for a p+ polysilicon TG 10 and an n+ polysilicon BG 14, and is shown by way of example. Other materials (e.g. TaN) and material types (e.g. p+ polysilicon) can be considered for TG 10 and BG 14.

FIG. 2A shows barrier heights used by the filter 9 during cell programming. There are two barrier heights relevant to the filtering mechanism for tunneling injection of valence electrons 42 at valence band 10b of TG 10. The first one is illustrated as a barrier height 50 ($\Delta\Phi_{VE\_TT}$) and relates to a first barrier for direct tunneling of electrons 42 through TD 11. The barrier height 50 to a first order equals the summation of the conduction band offset 11c between TG 10 and TD 11 and the energy gap Eg 10g of TG 10. The second one can be more clearly seen by referring to barrier 54 ($\Delta\Phi_{VE\_TB}$) in FIG. 7A. It relates to a second barrier formed by BD 12 and is equal to the summation of the conduction band offset 12c and Eg 10g in FIG. 1B when memory cell is in the flat-band condition. Similarly, there are two barrier heights relevant to the filtering mechanism for backward tunneling of holes 41 in valence band 14b of BG 14. Referring back to FIG. 2A, the first one relates to barrier formed by BD 12 and is illustrated as barrier height 51 ($\Delta\Phi_{VH\_GB}$). The barrier height 51 to a first order equals the valence band offset 12f between BG 14 and BD 12 (shown in FIG. 1B). The second one is illustrated as barrier height 52 ($\Delta\Phi_{VH\_GT}$) and relates to a valence band barrier formed by TD 11. The barrier height 52 is the offset between valence band of BG 14 and valence band of TD 11 at the interface of TD 11 and BD 12. As is apparent, the barrier height 52 equals the valence band offset 11f between BG 14 and TD 11 (in FIG. 1B) when in the flat-band condition. Turning back to FIG. 2A, to block the holes 41 at BG 14 from backward tunneling into TG 10, it is desired to keep both the barrier heights 52 and 51 high enough through out the voltage range of the program operation.

Figure 7A:
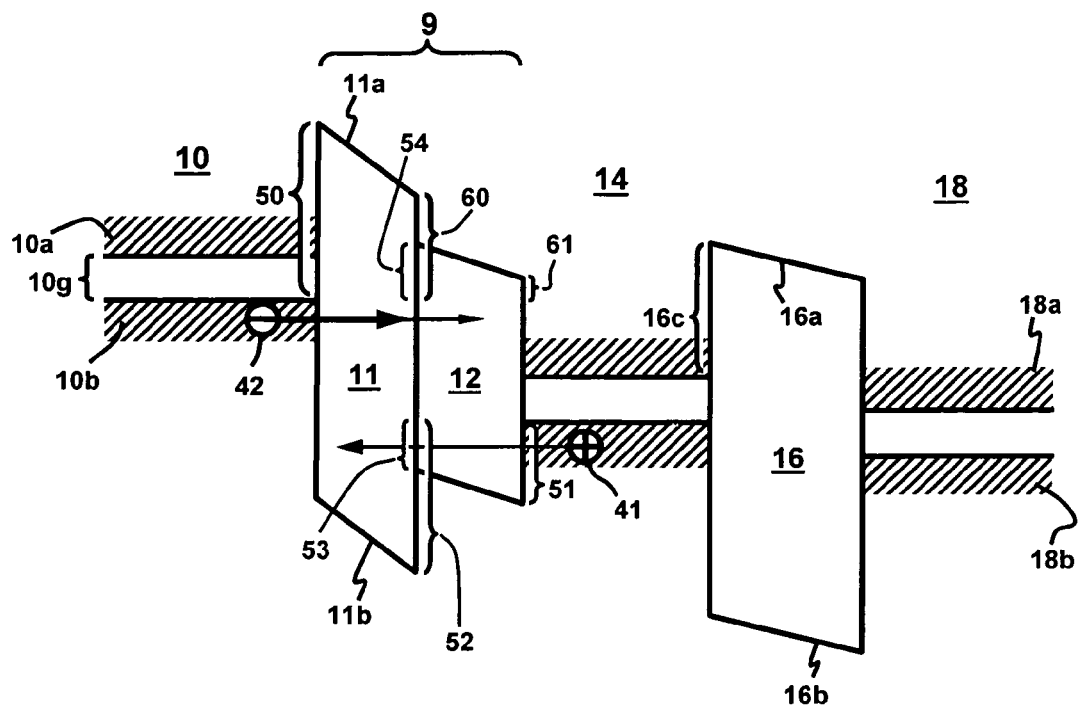
FIG. 7A is the energy band diagram of the structure of FIG. 1A, illustrating various barrier heights for blocking charges transport when biasing cell of the present invention under the condition of program disturb prevention.

Referring to FIG. 7A, the barrier height 54 ($\Delta\Phi_{VE\_TB}$) of the second barrier for VE 42 can be expressed to a first order by following formula:

$$\Delta\Phi_{VE\_TB} = \Delta\Phi_{CB\_TB} + Eg - |V_{TD}|$$

where $\Delta\Phi_{CB\_TB}$ is the conduction band offset 12c between TG 10 and BD 12, $V_{TD}$ is the voltage drop across TD during program, and is expressed as $$V_{TD} = (V_a - V_{fb})/[1 + (\epsilon_{TD} * T_{BD})/(\epsilon_{BD} * T_{TD})];$$

$V_a$ is the applied voltage across TG 10 and BG 14;

$V_{fb}$ is the flat-band voltage;

$\epsilon_{TD}$ and $\epsilon_{BD}$ is the dielectric constant for TD 11 and BD 12, respectively; and $T_{TD}$ and $T_{BD}$ is the thickness for TD 11 and BD 12, respectively.

Similarly, the barrier height 52 ($\Delta\Phi_{VH\_GT}$) of the second barrier for holes backward tunneling can be expressed as following formula:

$$\Delta\Phi_{VH\_GT} = \Delta\Phi_{VB\_GT} - |V_{BD}|$$

where $\Delta\phi_{VB\_GT}$ is the valence band offset 11f between BG 14 and TD 11, $V_{BD}$ is the voltage drop across BD 12 during program, and is expressed as $$V_{BD} = (V_a - V_{fb})/[1 + (\epsilon_{BD} * T_{TD})/(\epsilon_{TD} * T_{BD})].$$

Based on the theory, a concept on engineering barrier height for the filtering mechanism is provided herein. From the foregoing formula, it is clear that $\Delta\phi_{VE\_TB}$ and $\Delta\phi_{VH\_GT}$ have different dependence on $V_a$. The voltage dependence permits the two barrier heights 54 and 52 be electrically altered by applying a voltage across the dielectrics. Furthermore, the barrier height dependence on voltage is asymmetrical and is primary determined by the combined effects of dielectric constant and dielectric thickness (hereinafter "εT", and the effect is termed "εT effect"). In other words, by proper selecting a set of "εT" for TD 11 and for BD 12, one barrier height can be electrically altered in a different degree than the other. In an extreme case, at an applied bias, one barrier height can be altered to become disappear while the other one stays in similar range as one in the flat-band.

Figure 2B:
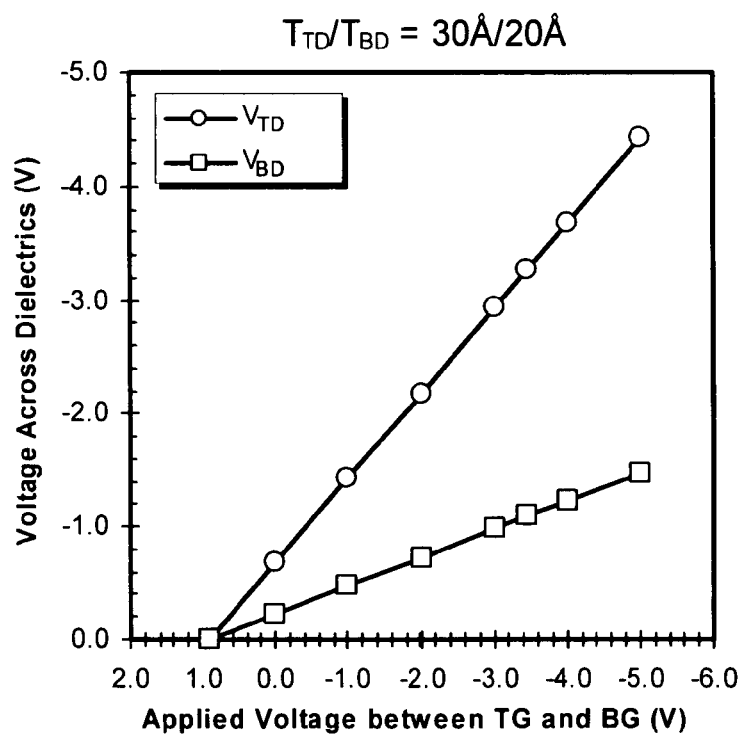
FIG. 2B illustrates the effect of the applied voltage between TG and BG on voltages across the tunneling and the blocking dielectrics in cell structure according to the present invention.
Figure 2C:
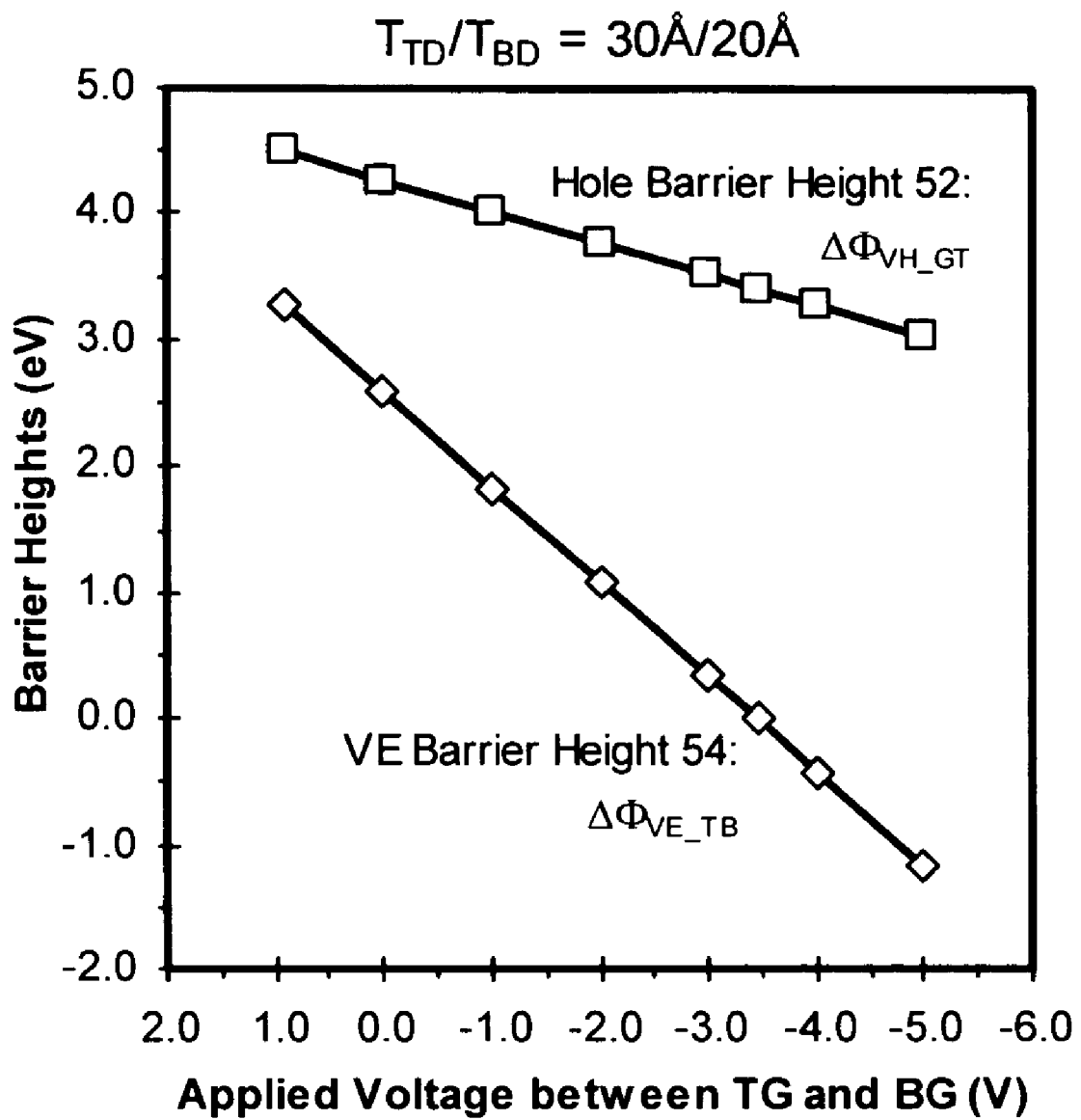
FIG. 2C illustrates the effect of the barrier height engineering concept of the present invention on the program operation, wherein the barrier heights of the forward tunneling and the backward tunneling can be altered in different degree by applying a negative voltage between TG and BG.

This effect is provided in the present invention and is used for the filtering mechanism on charge filtering, charge injection, and charge blocking. The effect can become clearer with referencing to FIGS. 2B and 2C. FIG. 2B shows the effect of voltages across each dielectric and their dependence on the applied voltage between TG 10 and BG 14. The materials in the specific embodiment here are assumed for TD 11 and BD 12. As is apparent, $V_{TD}$ is much larger than $V_{BD}$ for a same applied voltage between TG 10 and BG 14. In other words, a much larger voltage is seen across the material having a lower $\epsilon T$ effect. Note that $\epsilon T$ effect can be dominated by the dielectric constant provided the thicknesses of both dielectrics are in similar range. FIG. 2C illustrates an example on the barrier height engineering concept using the theory described herein. As is apparent, the barrier height 54 ($\Delta\Phi_{VE\_TB}$) for electrons at TG 10 decreases faster than the barrier height 52 ($\Delta\Phi_{VH\_GT}$) for holes 41 at BG 14 ($\Delta\Phi_{VE\_TB}$ 54 is in FIG. 7A). Referring to FIG. 2C, the barrier height 54 ($\Delta\Phi_{VE\_TB}$) in fact disappears (i.e. equals zero) at an applied voltage of about −3.5V between TG 10 and BG 14 while there is still a barrier height of about 3.4 eV remained for the barrier height 52 ($\Delta\phi_{VH\_GT}$). FIG. 2A illustrates the energy band diagram when the applied voltage is at or beyond this voltage level. As shown in FIG. 2A, VE 42 in TG 10 can tunnel through TD 11 in direct tunneling without being blocked by BD 12 layer. This permits electrons tunneling in the forward direction. The much weaker dependence of barrier height 52 ($\phi\Phi_{VH\_GT}$) on the applied voltage maintains the barrier for blocking holes in this voltage range and hence can prevent holes from backward tunneling. Therefore, the barriers engineering concept here actually provides a method through which an electrically alterable filter is constructed for charge injection using tunneling mechanism. The filter provides unique feature filtering out the unwanted carriers (i.e. the backward tunneling holes) without affecting the transport of the wanted carriers (i.e. the forward tunneling electrons).

Though not mentioned, it is however desirable to keep the voltage across BD ($V_{BD}$) be less than the barrier height 51 ($\Delta\Phi_{VH\_GB}$) in voltage range normally used for program. Keeping $V_{BD}$ lower than barrier height 51 is desirable because it can maintain a trapezoidal-shaped band structure for holes barrier in BD 12 region. This barrier structure can become clear by referring to FIG. 2A, wherein a barrier height $\Delta\Phi_{VH\_GBT}$ 53 is shown and relates to the offset between the valence band of BG 14 and the valence band of BD 12 at the interface of TD 11 and BD 12. The barrier height 51 forms the barrier height of one side of the barrier (the entrance side for holes 41) and barrier height 53 forms the barrier height of the other side of the barrier (the exit side for holes 41). The two barrier heights thus form a trapezoidal barrier for holes 41. A trapezoidal barrier is advantageous because it provides a stronger effect on blocking holes 41 from backward tunneling than that provided by a triangular shaped barrier. The barrier height 53 at the exit side of the trapezoidal barrier to first order equals $\Delta\Phi_{VB\_GB}-V_{BD}$, where $\Delta\Phi_{VB\_GB}$ is the valence band offset 12f between BG 14 and BD 12. In the specific embodiment, for a maximum program voltage of −4V between TG 10 and BG 14, the barrier height 53 is about 0.7 eV, and hence the trapezoidal barrier is maintained. It is clear that barrier height 53 can be made higher by lowering $V_{BD}$ through optimizing dielectric constant and thickness of TD 11 and BD 12, as taught in the foregoing theory.

The energy band in FIG. 2A is illustrated with electrons 42 in VB 10b of TG 10 be tunneled through TD 11, through BD 12, and into BG 14 region. The energy band is illustrated to reflect the barrier engineering concept with emphasis on the barrier structure of TD 11 and BD 12 that is used to block the holes 41 from backward tunneling. Due to the larger dielectric constant illustrated in BD 12 region, a smaller band bending and hence a smaller voltage across BD 12 is illustrated. The voltage across TD 11 is illustrated larger than BD 12 due to the difference on $\epsilon T$ effect between the two. A larger dielectric constant for BD 12 region is desirable for following considerations. First, it permits the energy band of BD 12 region be more like the original "rectangular shape" structure in the flat-band (see FIG. 1B). In other words, there is a less bending on the energy band of BD as voltage is applied across the structure. As aforementioned, the "rectangular shape" band structure is desirable as it provides a trapezoidal-shaped tunneling barrier in BD 12 and is a more effective barrier on blocking unwanted charge carriers tunneling therethrough. Furthermore, the larger dielectric constant for BD 12 permits a larger portion of the program voltage appearing across TD 11 region. It thus preserves the effects on tunneling the wanted charges while the program voltage is maintained at a same level. Some of these tunneling charges (i.e. electrons) will be able to ballistically transport across the BG 14 region to reach the interface between BG 14 and RD 16, and subsequently be collected on FG 18 region when a proper bias between TG 10 and BG 14 is chosen such that these electrons can transport at energy higher than the electron barrier height 16c of RD 16.

Barrier Heights Engineering for Erasing the Memory Cell

Figure 3A:
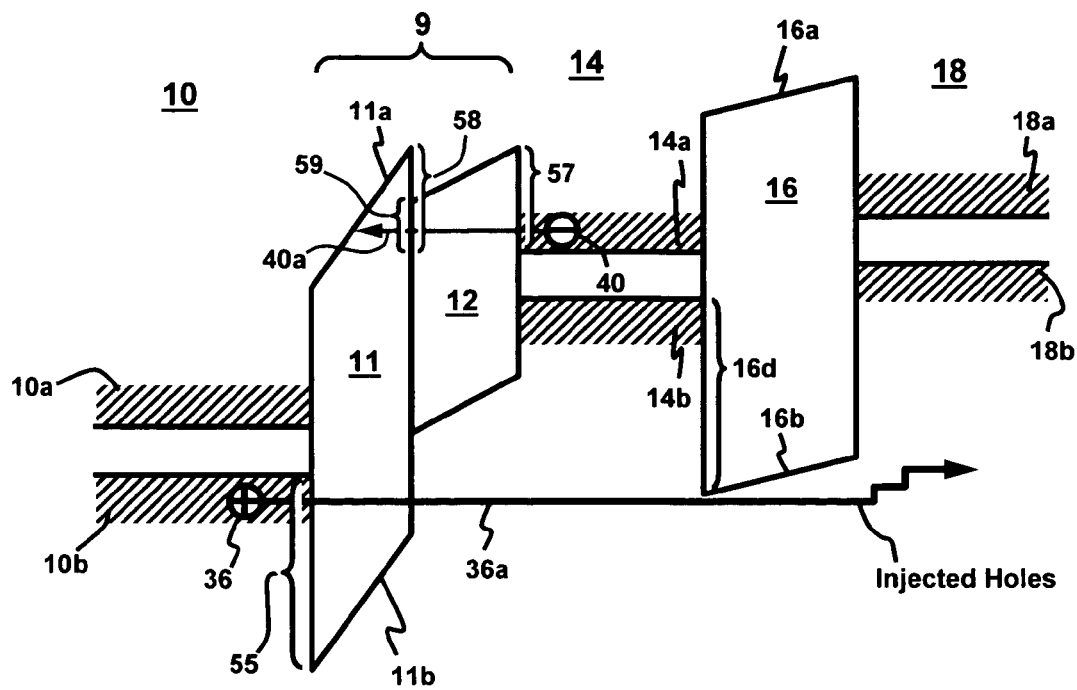
FIG. 3A is the energy band diagram of the structure of FIG. 1A, illustrating various barrier heights under the erase condition, and further illustrating the barrier heights and the trapezoidal barrier structure for blocking the electron carriers from backward tunneling.

The erase of the memory cell is illustrated in the energy band diagram in FIG. 3A, wherein the memory cell is assumed in a program state initially (i.e. FG 18 negatively charged to result in a negative potential with respect to the BG 14 potential). Erase operation is performed by injecting hole charges 36 to neutralize the negative charges on FG 18 and to convert FG 18 to a positively charged state.

Referring to FIG. 3A, there is shown the energy band diagram along regions from TG 10 to FG 18 in cell 100 according to the present invention when TG 10 is positively biased with respect to the BG 14 by an erase voltage (e.g. in the range of about −5V to about −6V). Further, there is shown holes 36 transporting through the filter 9, the BG 14, the RD 16, and finally be collected and stored on FG 18. An example on voltages applied to each region is: +2.5V applied to TG 10, −2.5V applied to BG 14, and −3V applied to the source 22 and drain 26. Similar to the energy band diagram illustrated in the program operation (see FIG. 2A), the energy band diagram in FIG. 3A is illustrated on cell with the asymmetrical tunneling structure and with the n+polysilicon BG 14. As will be described later, the n+ polysilicon cannot be employed for the BG 14 region in prior art band structure due to its lower work function than that of a p+ polysilicon.

The barrier height engineering concept and filtering mechanism illustrated in the program operation can be similarly applied to the erase operation in memory cell of the present invention, and is illustrated herein. There are two barrier heights relevant to the filtering mechanism for tunneling injection of holes 36 at valence band 10b (VB) of TG 10. The first one relates to valence band barrier of TD 11 and is illustrated as barrier height 55 ($\Delta\Phi_{VH\_TT}$). The barrier height 55 to a first order equals the valence band offset 11d between TG 10 and TD 11 (see FIG. 1B). The second one can be more clearly seen by referring to barrier height 56 ($\Delta\Phi_{VH\_TB}$) in FIG. 8A. The barrier height 56 relates to barrier formed by BD 12 and is equal to the valence band offset 12d ($\Delta\Phi_{VB\_TB}$) between TG 10 and BD 12 when energy band is in the flat-band condition (see FIG. 1B). Similarly, there are two barrier heights relevant to the backward tunneling of conduction electrons 40 (CE) at conduction band 14a of BG 14. Referring back to FIG. 3A, the first one is illustrated as barrier height 57 ($\Delta\Phi_{CE\_GB}$) and relates to conduction band barrier formed by BD 12. The barrier height 57 to a first order equals the conduction band offset 12e ($\Delta\Phi_{CB\_GB}$) between BG 14 and BD 12 (see FIG. 1B). The second one relates to conduction band barrier formed by TD 11 and is illustrated as barrier height 58 ($\Delta\Phi_{CE\_GT}$) in FIG. 3A. The barrier height 58 is the offset between the conduction band of BG 14 and the conduction band of TD 11 at the interface of TD 11 and BD 12. As is apparent, the barrier height 58 equals the conduction band offset 11e in FIG. 1B when in the flat-band condition. In FIG. 3A, to block the electrons 40 at BG 14 from backward tunneling into TG 10, it is desired to keep the barrier height 58 and the barrier height 57 both high enough through out the voltage range in the erase operation.

The barrier height 56 ($\Delta\Phi_{VH\_TB}$) of the second barrier for holes tunneling injection can be expressed to a first order by following formula:

$$\Delta\Phi_{VH\_TB} = \Delta\Phi_{VB\_TB} - |V'_{TD}|$$

where
$\Delta\Phi_{VB\_TB}$ is the valence band offset 12d between TG 10 and BD 12,
$V'_{TD}$ is the voltage drop across TD 11 during erase, and is expressed as $$V'_{TD} = (V_a - V_{fb}) / [1 + (\epsilon_{TD} * T_{BD}) / (\epsilon BD * T_{TD})].$$

Similarly, the barrier height 58 ($\Delta\Phi_{CE\_GT}$) of the second barrier for blocking electrons backward tunneling can be expressed as following formula:

$$\Delta\Phi_{CE\_GT} = \Delta\Phi_{CB\_GT} - |V'_{BD}|$$

where
$\Delta\Phi_{CB\_GT}$ is the conduction band offset 11e between BG 14 and TD 11,
$V'_{BD}$ is the voltage drop across BD 12 during erase, and is expressed as $$V'_{BD} = (V_a - V_{bf}) / [1 + (\epsilon_{BD} * T_{TD}) / (\epsilon_{TD} * T_{BD})].$$

From the formula provided herein, it is clear that barrier height 56 ($\Delta\Phi_{VH\_TB}$) and barrier height 58 ($\Delta\Phi_{CE\_GT}$) have different dependence on $V_a$. The barrier height dependence on voltage is asymmetrical and is primarily determined by the combined effects of dielectric constant and dielectric thickness (i.e. the "$\epsilon$T effect"). This effect is similar to that provided by the two barrier heights 54 and 52 in the barrier height engineering for program operation described hereinbefore. It is therefore clear that the barriers can be electrically altered in the erase operation in a similar manner as that provided in the program operation. The concept on engineering barrier height can be applied to the erase operation in a similar manner.

Figure 3B:
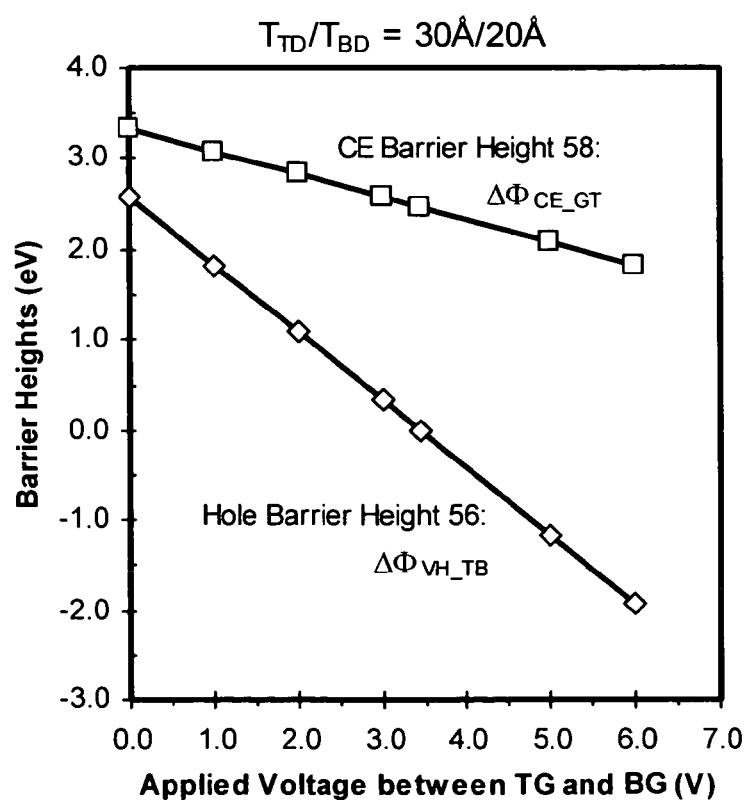
FIG. 3B illustrates the effect of the barrier height engineering concept of the present invention on the erase operation, wherein the barrier heights of the forward tunneling and the backward tunneling can be altered in different degree by applying a positive voltage between TG and BG.

FIG. 3B illustrates an example on the barrier height engineering concept using the theory described herein for the erase operation. As is apparent, the barrier height 56 ($\Delta\Phi_{VH\_TB}$) for holes at TG 10 decreases at a faster rate than the barrier height 58 ($\Delta\Phi_{CE\_GT}$) for electrons at BG 14. In fact, the barrier height 56 disappears (i.e. equals zero) at an applied voltage of about +3.5 V between TG 10 and BG 14 while there is still a barrier height of about 2.5 eV remained for the barrier height 58 ($\Delta\Phi_{CE\_GT}$). Thus, when the applied voltage is altered beyond this point, holes 36 in TG 10 can tunnel through TD 11 in quantum mechanical tunneling without being blocked by BD 12 layer. This permit holes 36 tunneling in the forward direction to become holes 36a. The much weaker dependence of the barrier height 58 ($\Delta\Phi_{CE\_GT}$) on the applied voltage maintains the barrier for blocking electrons 40 in this voltage range and hence prevents electrons 40 from backward tunneling into TG 10. Similar to the effect demonstrated in the program operation, the barriers engineering concept here provides a method through which an electrically alterable filter is constructed for the erase operation to filter out the unwanted carriers (e.g. the backward tunneling electrons 40a in FIG. 3A) without affecting the transport of the wanted carriers (e.g. the forward tunneling holes 36a in FIG. 3A).

It is desirable to keep the voltage across BD 12 ($V_{BD}$) be less than the barrier height 57 ($\Delta\Phi_{CE\_GB}$) in voltage range normally used for erase operation to maintain a trapezoidal-shaped band structure for electrons barrier in BD 12 region. This barrier structure can be clearer captured by referring to FIG. 3A, wherein a barrier height 59 ($\Delta\Phi_{CE\_GBT}$) is shown and relates to the offset between the conduction band of BG 14 and the conduction band of BD 12 at the interface of TD 11 and BD 12.

The barrier height 57 forms the barrier height of one side of the barrier (the entrance side for electrons 40) and the barrier height 59 forms the barrier height of the other side of the barrier (the exit side for electrons 40). The two barrier heights form a trapezoidal barrier in BD 12 for blocking electrons 40. The trapezoidal barrier is advantageous because it provides a stronger effect on blocking electrons backward tunneling than that provided by a triangular shaped barrier. The barrier height 57 at the entrance side of the trapezoidal barrier to a first order equals the conduction band offset 12e between BG 14 and BD 12 (in FIG. 1B). Similarly, the barrier height 59 at the exit side of the trapezoidal barrier to a first order equals $\Delta\Phi_{CB\_GB} - V'_{BD}$, where $\Delta\Phi_{CB\_GB}$ is the conduction band offset 12e between BG 14 and BD 12. In the specific embodiment, for a maximum erase voltage of +6 V between TG 10 and BG 14, the barrier height 59 is about 0.85 eV. Thus, the trapezoidal barrier is maintained through out the erase operation of the memory cell. It is clear that the barrier height 59 can be made higher by lowering $V'_{BD}$ through optimizing dielectric constant and thickness of TD 11 and BD 12, as taught in the foregoing theory.

The energy band in FIG. 3A is illustrated with holes 36 in VB 10b of TG 10 be transported through TD 11, through BD 12, through BG 14, and finally be collected on FG 18 region. The energy band is illustrated to reflect the barrier engineering concept with emphasis on the barriers that are used to block electrons 40 from backward tunneling. Due to the larger dielectric constant illustrated for BD 12 region, a smaller band bending and hence a smaller voltage across BD 12 is illustrated. The voltage across TD 11 is illustrated larger than BD 12 due to its lower dielectric constant. A larger dielectric constant for BD 12 region is desirable for following considerations. First, it permits the energy band of BD 12 region be more like the original "rectangular shape" structure in the flat-band (see FIG. 1B). This provides a more effective barrier in BD 12 for blocking unwanted charge carriers (e.g. the parasitic electrons 40) from backward tunneling. Furthermore, the larger dielectric constant for BD 12 permits a larger portion of the erase voltage appearing across TD 11 region. It thus preserves the effects on tunneling the wanted charges (e.g. holes 36) while the erase voltage is maintained at the same level. Some of these tunneling holes 36a will be able to transport across the BG 14 region in ballistic transport mechanism to reach the interface between BG 14 and RD 16, and subsequently be collected on FG 18 region in this erase operation.

As mentioned hereinbefore, a straight employment of the prior art energy band structure for ballistic transport in memory cell operations can present several fundamental problems. The advantages of the present invention can best be understood with an understanding on these problems, as will be described next.

Figure 4:
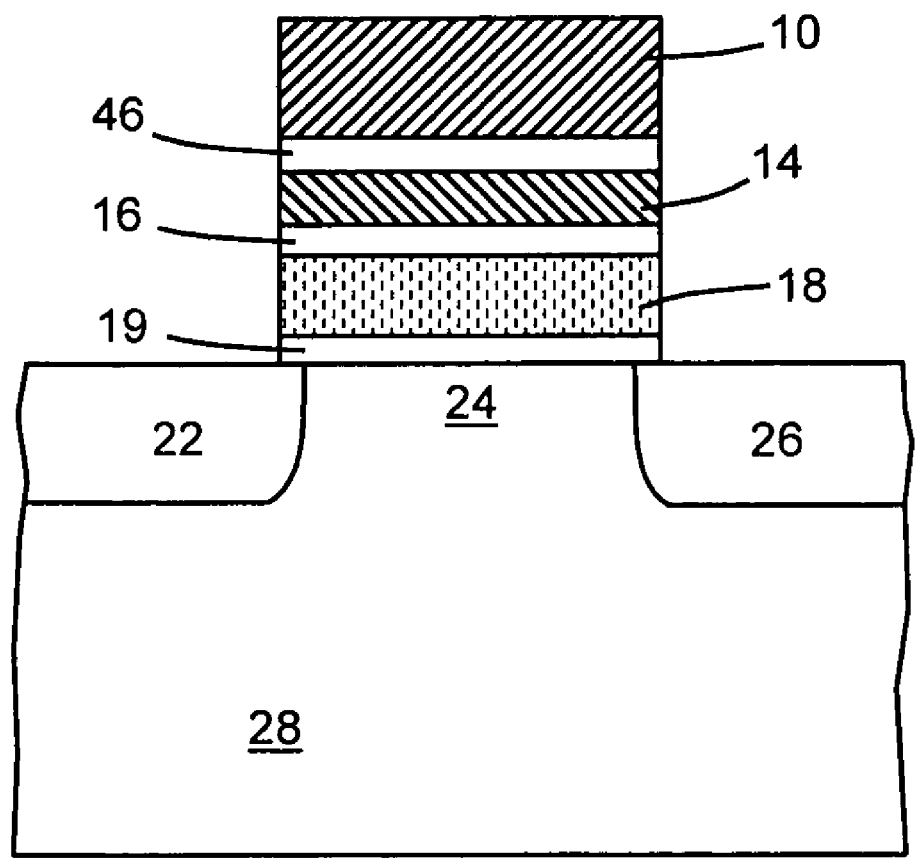
FIG. 4 illustrates a cross sectional view of a memory cell architecture without filter structure.

FIG. 4 shows a cell architecture constructed based on the prior art energy band structure. The cell is similar to the cell 100 of the present invention except without the filter 9 of cell 100. An insulator 46 (e.g. oxide, oxynitride, $ZrO_2$, $Al_2O_3$ etc.) is used instead and is sandwiched in between the tunneling gate (TG 10) and the ballistic gate (BG 14) to form a plain injector having the symmetrical tunneling structure of prior art. Material with a large work function (e.g. p-type polysilicon, platinum etc.) is required for both BG 14 and TG 10 in order to control backward tunneled electrons from BG 14 and to supply both type of charges (hole and electron) from TG 10. For illustration purpose, p+ polysilicon is assumed for both TG and BG.

Figure 5A:
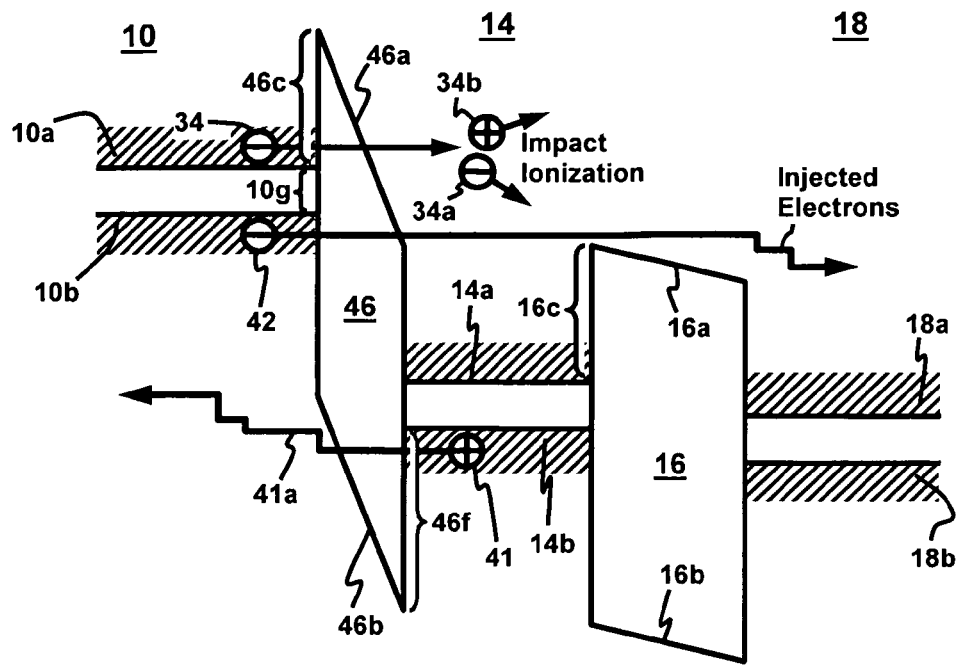
FIG. 5A is the energy band diagram of the cell structure of FIG. 4, illustrating the impact ionization problem in the energy band diagram of prior art.
Figure 5B:
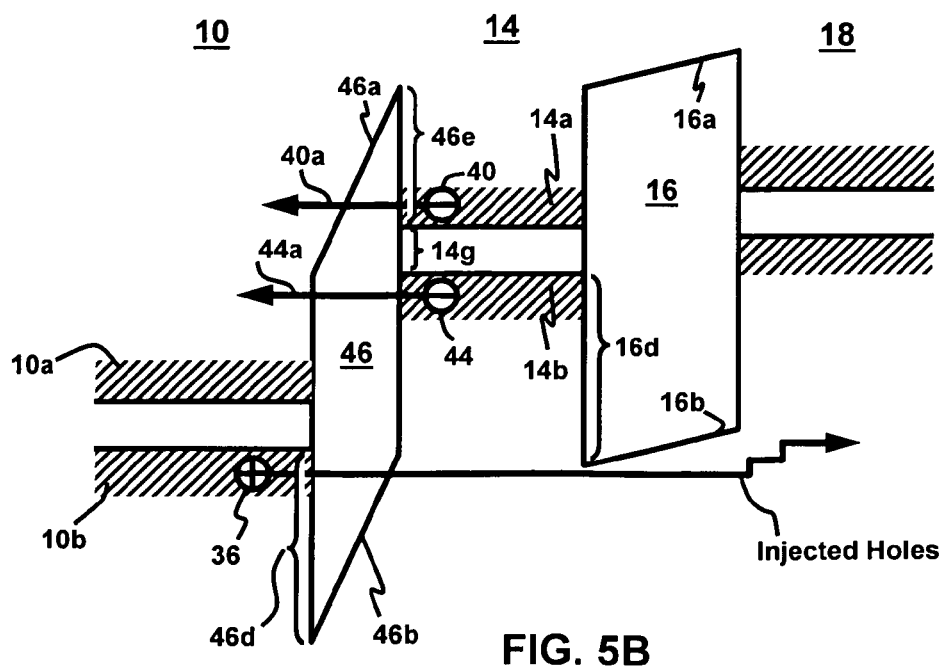
FIG. 5B is the energy band diagram of the cell structure of FIG. 4, illustrating the effect of the parasitic conduction electrons and problems in the energy band diagram of prior art.

FIGS. 5A and 5B illustrate the energy band diagram for cell of FIG. 4 when placed under program and erase operations, respectively. The energy band diagrams are illustrated for a p+ polysilicon TG 10 and a p+ polysilicon BG 14. The insulator 46 has a conduction band 46a and a valence band 46b. The figures further show the symmetrical tunneling structure for the plain injector, which includes TG 10, insulator 46, and BG 14.

Problems in Memory Cell of Prior Art Energy Band Structure

1. Problems on Impact Ionization in BG and in TG

Figure 6:
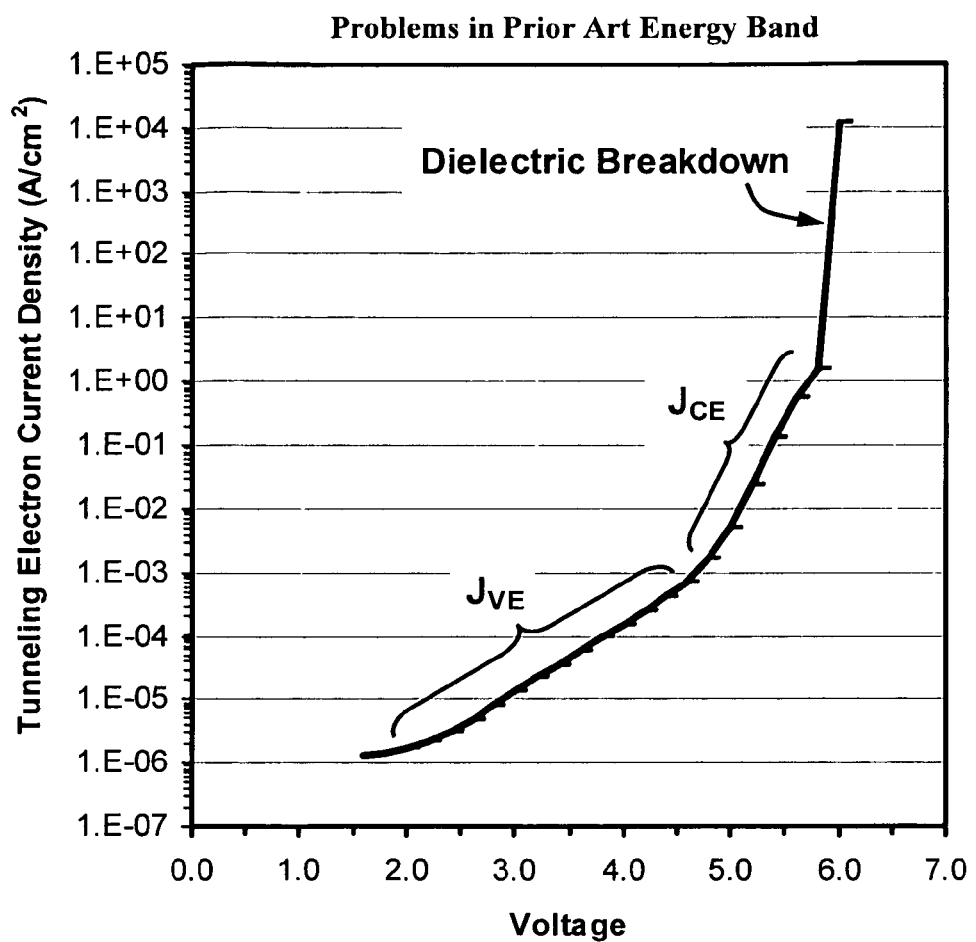
FIG. 6 illustrates the tunneling electron current density as a function of the applied voltage for various electron current components, and further illustrating the dielectric breakdown problem in the erase operation of the memory cell of FIG. 4.

Please refer to FIG. 5A on this problem. When employing the ballistic transport mechanism for the program operation, a typical voltage of −2 V and a +2 V is required to be applied to the TG 10 and BG 14, respectively. The voltage difference between TG 10 and BG 14 has to be greater than a minimum voltage in order to supply sufficient energy for VE 42 to surmount the barrier height 16c of RD 16. However, due to the high bias thus introduced across the insulator 46, an inversion layer of CE 34 can be formed in the conduction band 10a of TG 10 even though TG 10 is formed of p+ polysilicon. Further, another mechanism that can form CE 34 in TG 10 is through the impact generation process triggered by holes 41a in TG 10. As is clearly shown in FIG. 5A that holes 41 in valence band 14b of BG 14 can backward tunnel into TG 10 to become holes 41a. As these holes enter into TG 10, their energy can be high enough to generate secondary CE 34 through impact ionization. The CE thus generated is termed "Impact-Ionized CE". As illustrated in FIG. 6, in such range of bias, the current of CE ($J_{CE}$) is much higher than the current of VE ($J_{VE}$). In other words, the generated CE 34 (either through inversion or through impact-ionization) can dominate the tunneling current between TG 10 and BG 14.

Likewise, impact ionization problem can also happen in BG 14 and can be triggered by CE 34 from TG 10. As described above, the CE 34 in TG 10 is inadvertently generated under high bias. The presence of CE 34 is not desirable as it carries a much higher energy (at least about an energy gap Eg 10g higher) than that carried by VE 42. As illustrated in FIG. 5A, the CE 34 can tunnel through insulator 46 and enter into BG 14 at such a high energy that subsequently causes impact ionization in BG 14, where pairs of electrons 34a and holes 34b are created therein.

All the effects described herein create parasitic carriers (i.e. CE 34 in TG 10, and 34a and 34b in BG 14). The effects and the parasitic carriers generated thereby are uncontrollable. The current generated by these effects can unduly increase to result in current loading and/or circuit breakdown problems to supporting circuitries in memory operations. To avoid these problems in program operation, the allowable maximum voltage between TG 10 and BG 14 has to be limited under a threshold voltage to avoid the formation of CE 34 in TG 10. The range between the minimum and the maximum program voltage defines a workable voltage range for program operation, and is quite narrow (less than about 0.6V). The plain injector cell of FIG. 4 thus demands stringent control on the threshold voltage, and is believed having low manufacturability yield and difficulties in practical applications.

Similar to the program operation, in the erase operation (referring to FIG. 5B), the impact-ionization process can also occur in TG 10 due to electrons 40a backward tunneled from BG 14. The backward tunneled electrons 40a are from parasitic CE 40 of BG 14 (to be described next), and can have an energy high enough to impact ionized hole carriers in TG 10 to cause loading problems on supporting circuitry in memory operations. The plain injector cell of prior art energy band structure thus faces similar issues in both the program and the erase operations, and has fundamental difficulties in practical applications.

2. Problems on Parasitic-Charges Backward Tunneling

FIG. 5B further shows the problem on parasitic electrons CE 40 and VE 44 tunneled along backward direction. In FIG. 5B, there are shown valence electrons 44 (VE) in the valence band 14b and conduction electrons 40 (CE) in the conduction band 14a of the BG 14 region. When using the energy band structure of the plain injector in FIG. 5B for injecting hole 36 in the forward direction, the backward tunneled electrons can be somewhat suppressed by choosing material with larger work function (or lower Fermi-level energy), such as a p+ polysilicon, for BG 14. P+ polysilicon for BG 14 is desirable because CE 40 (FIG. 5B) in that region is usually negligible. However, due to the symmetrical energy band structure, the backward tunneled VE 44 cannot be completely suppressed when TG 10 is used for injecting both types of carriers (i.e. electrons for program and holes for erase). An optimum energy band structure for the plain injector would be choosing materials for TG 10, BG 14, and insulator 46 such that the Fermi-level energy of TG 10 and of BG 14 lies at the middle of the energy gap of insulator 46. Such energy band structure can keep backward tunneling current of VE 44 at a similar current level as that of the forward tunneling holes 36. In other words, the backward tunneling current in the plain injector cannot be entirely suppressed. This causes waste on total current when the forward tunneling current is the only current of interest in contributing to the cell operations, and is a fundamental problem in the plain injector band structure.

There are several other fundamental deficiencies on the plain injector structure as described next with reference to FIGS. 5B and 6.

Referring back to FIG. 5B, as mentioned the CE 40 in the p+ polysilicon BG 14 region is usually negligible when a low voltage is applied between TG 10 and BG 14. Therefore, the associated CE tunneling current is negligible. The parasitic electrons thus mainly comprise VE 44 which is tunneled to the TG 10 region through a trapezoidal-shaped barrier (also known as "direct tunneling"). The barrier height for electrons 44 at valence band (VB) 14b of BG 14 equals the summation of the conduction band offset 46e between BG 14 and insulator 46 and the energy gap Eg 14g of BG 14. However, when a large voltage (e.g. 5V) is applied between TG 10 and BG 14, the portion of BG 14 next to the insulator 46 can be inadvertently inverted and thus a layer of CE 40 is formed therein near the interface between insulator 46 and BG 14. The CE 40 can be emitted into TG 10 region to become CE 40a therein through a tunneling process. The tunneling can be through a triangle-shaped tunneling barrier (also known as "Fowler-Nordheim tunneling") having a barrier height 46e that is one Eg 14g lower than that for tunneling VE 44. Therefore, a much stronger tunneling current is expected once tunneling process for CE 40 start.

FIG. 6 illustrates the parasitic currents $J_{CE}$ and $J_{VE}$ of the CE 40a and VE 44a, respectively, for the plain injector having symmetrical energy band structure in connection with FIG. S 5A and 5B. Due to the symmetrical energy band, the current-voltage relationship of FIG. 6 is used for both FIGS. 5A and 5B. In FIG. 6, there is shown the voltage dependence of current $J_{CE}$ be much stronger than that of the parasitic VE current $J_{VE}$ due to the much stronger dependence of tunneling current on voltage when charges tunneling through a triangle-shaped barrier. In this voltage range, the CE 40a dominates the parasitic VE 44a and hence the total parasitic electrons in TG 10. Note that this effect is work function independent. The p+ polysilicon/insulator/p+ polysilicon plain injector described above overlook such effect, and hence the cell can suffer from the parasitic carriers backward tunneling regardless of the work function. Therefore, the cell of FIG. 4 cannot function properly with a plain injector band structure.

While increasing the work function (or lowering the Fermi-level energy) of BG 14 to suppress the parasitic electrons from backward tunneling during the erase operation, the symmetrical tunneling structure in prior art can suffered from the backward tunneling of parasitic holes in the program operation. Referring to FIG. 5A, as work function of BG 14 is increased to suppress parasitic electrons, once it's beyond a level where the valence band offset 46f between BG 14 and insulator 46 becomes less than the conduction band offset 46c between TG 10 and insulator 46, the parasitic holes 41a tunneled from BG 14 into TG 10 can become significant and thus results in problems to the program operation similar to that caused by the parasitic electrons to the erase operation. Therefore, the symmetrical tunneling structure of the plain injector cannot be optimized to suppress parasitic charge carriers for both program and erase operations simultaneously. Such problem prevents TG 10 in cell of the prior art from being used as a single electrode for supplying both types of charges (i.e. electrons and holes). Therefore, the cell in FIG. 4 requires two separate tunneling gates: one for electron tunneling injection, and the other one for hole tunneling injection. This requirement results in larger cell size, and limits the cell of FIG. 4 from practical application.

3. Problems on Dielectric Breakdown

As described in the erase operation, a typical voltage of +2.5 V and a −2.5V is applied to the TG 10 and BG 14, respectively. The voltage difference between TG 10 and BG 14 has to be greater than a minimum voltage in order to supply sufficient energy for holes 36 to surmount the barrier height 16d of RD 16. However, for the insulator 46 of the plain injector structure, such voltage results in a maximum field in the range of about 10 MV/cm to about 20 MV/cm across the insulator 46. In such range of high field, the insulator 46 is believed suffered from dielectric breakdown (see FIG. 6). To avoid a dielectric breakdown event in operation of FIG. 4 cell, the maximum allowable voltage between TG 10 and BG 14 has to be limited under the dielectric breakdown voltage of insulator 46. The range between the minimum and the maximum voltages thus defines a workable voltage range for the erase operation, and is quite narrow (less than 0.7V). The cell structure of FIG. 4 thus demands stringent control on the dielectric breakdown, and is believed having low manufacturability yield and difficulties in practical applications.

4. Problems on Parasitic Capacitance

In the cell of FIG. 4 of plain injector band structure, the thickness of the insulator 46 layer are chosen with a limitation on thickness typically in the range of about 20 Å to 40 Å in order to permit charge carriers tunneling through insulator 46 in the overlap region. Therefore, it results in a large parasitic capacitance C between TG 10 and BG 14, and is undesirable as it introduces adverse impact on cell operation. The capacitance problem can be better understood by referring to the diagram in FIG. 10A, wherein $C_{BG-TG}$ is the capacitance between BG 14 and TG 10, and $C_{BG-FG}$ is the capacitance between BG 14 and FG 18. The total capacitance $C_{BG}$ seen by BG 14 comprises two main components shown in FIG. 10A, and approximately equals the summation of $C_{BG-FG}$ and $C_{BG-TG}$. In most situations, $C_{BG}$ can be dominated by $C_{BG-TG}$ due to the much thinner thickness for the insulator 46 layer than that for the RD 16 layer, which is typical in the range of 80 to 100 Å. The capacitance issue is worse when employing dielectric with higher dielectric constant (e.g. oxynitride), which is usually considered for suppressing the parasitic electrons in BG 14 during hole injection in the erase operation. Therefore, the cell of plain injector band structure further suffers from the compromise between suppressing the parasitic electrons and suppressing the $C_{BG}$.

5. Problems on Large Resistance

For operating cell using ballistic transport mechanism, the BG 14 layer is desirable to be with a thickness in the range of a few times of the mean-free path of carrier scattering (typically in the range of 100-200 Å), in order to permit the injected carriers transporting through BG 14 layer with good efficiency. The needs on a thin thickness unavoidably results in a high sheet resistance to the BG 14 layer. As described earlier, to reduce parasitic electron tunneling (see FIG. 5B), cell of plain injector in FIG. 4 is limited to using p-type Si for both TG 10 and BG 14 when polysilicon is used as the material for TG 10 and BG 14. It is known that p+ polysilicon typically has a higher resistivity than that of an n+ polysilicon. Therefore, the cell of plain injector suffers from a much larger resistance R on the BG 14. The adverse effect of a large R on performance of plain injector cell can be understood from several directions. First, it can cause a large signal delay due to the combining effects of the large R and the large C (i.e. the RC delay). This is particularly a main problem on cell operation as the RC delay can limit the speed on accessing a memory cell when embedded in a large memory array. Secondly, for disturb prevention on un-selected cells, an optimum set of predetermined voltages usually are required to be applied to those cells. However, due to the RC delay, voltages on un-selected cells can be different than the desired values, and hence cell disturb is more prone to happen. Furthermore, the large R can combine with a large current I to result in a IR effect, which can cause a voltage drop when passing a voltage in a signal line. The effect prevents the voltage on a designated electrode of a memory cell from reaching its desired level, and hence can adversely impact cell operation. For example, the adverse impact on an un-selected cell can be an undesired cell disturb, where the cell state is unintentionally changed from one logic state (e.g. a "0") to the other (e.g. a "1"). The IR impact on a selected cell can be a slower speed on cell operations (i.e. program, erase, and read operations). The IR effect can results significant voltage drop in the signal line such that voltage between TG and BG is below the voltage range for cell operations. In such case, carriers (e.g. VE 42 in FIG. 5A and holes in FIG. 5B) cannot have sufficient energy to surmount barrier of RD 16 to get collected on FG 18, and hence result in a failure on program or erase operations.

6. Problems on Weak Voltage-Dependence of Tunneling Current

As described before, in energy band structure for the plain injector cell of FIG. 4, the optimum way preventing the backward tunneled parasitic charges from dominating the forward tunneled charges is by keeping current of forward-tunneling carriers (e.g. holes) at similar current level as that of the backward tunneling one (e.g. parasitic electrons). However, this type of band structure also results in a weak voltage-dependence on the current-voltage relationship. For example, the current at an erase disable condition (i.e. the condition to prevent an unselected cell from an erase disturb) is usually seen only $10^4$ times lower than that for the erase condition. Similar problems can be seen in the program disable condition of such cell. Therefore, unselected cells of the plain injector band structure are prone to cell disturb problems in both program and erase operations.

The unique portion of present invention lies in the effects provided by the barrier engineering concept. The effects remove the requirement on a large work function for the BG 14 material as described in connection with FIGS. 4, 5A, and 5B on the plain injector cell and energy band structure. In fact, the present invention employs n+ polysilicon, which has a smaller work function, as the material for BG 14 to illustrate this advantage. This advantage provides more flexibility and options on selecting material having low sheet resistance, such as polysilicon of n-type impurities (e.g. Arsenic, phosphorous etc) or other type materials, to avoid the problem on large resistance as described above in the plain injector cell.

The filter 9 as described in connection with FIGS. 1A, 1B, 2A, and 3A of the present invention thickens the total dielectric thickness between TG 10 and BG 14, thus has advantages on suppressing the large parasitic capacitance between TG 10 and BG 14 described above. Moreover, it provides a voltage divider function dividing the applied voltage to different regions of filter 9 as shown in $V_{TD}$ and $V_{BD}$ of FIG. 2B. This effect can lower the voltage drop across TD 11 and BD 12 without compromising charge carriers injection along the forward direction, and can bring several advantages to the present invention. First, it can prevent TD 11 and BD 12 from the dielectric breakdown problem described in connection with FIG. 6. In addition, in the situation when a p+ polysilicon is used as the material for TG 10, the lower voltage across TD 11 can prevent parasitic electrons CE 34 from being formed in TG 10, and hence can prevent the impact ionization issue in BG 14 as described in connection with FIG. 5A. Similarly, in the situation when p+ polysilicon is used for BG 14, the lower voltage across BD 12 can prevent parasitic electrons CE 40 from being formed in BG 14, and hence can prevent the impact ionization issue in TG 10 as described in connection with FIG. 5B.

Please refer to both FIGS. 2A and 5A on backward tunneling problem in program operation. As can be seen in FIG. 5A, the parasitic holes 41 backward tunneling, which can be inadvertently introduced while using a larger work function material for BG 14, is effectively avoided by the filter 9 in FIG. 2A of the present invention. Furthermore, the issue on the impact-ionized CE 34 in TG 10 as described in connection with FIG. 5A is effectively addressed by the filter 9 in FIG. 2A while blocking the parasitic holes 41 from backward tunneling.

Please refer to both FIGS. 2B and 5B on the backward tunneling problem in erase operation. As can be seen in FIG. 5B, the effect of CE 40 inadvertently introduced in the plain injector cell can be effectively suppressed by the barrier height engineering and filter structure as described in connection with FIG. 2B. Moreover, the impact-ionization issue in TG 10, which is triggered by CE 40 in BG 14, can be effectively addressed by filter 9 while blocking CE 40 from backward tunneling.

It is thus clear the energy band structure in the cell of the present invention can effectively block charge carriers from tunneling along the backward direction for both erase and program operations. Though not required, it is generally desirable that the material for BG 14 has a Fermi level in the flat band condition lies in about the middle, of the energy band gap of BD 12 to best utilize the charge blocking mechanism when the band structure is employed in constructing the cell.

Barrier Heights Engineering for Disturb Prevention

As memory cell are placed in an array environment, cell state (e.g. a "0") can be unintentionally changed to the other state (e.g. a "1") during the useful lifetime of usage due to cumulative disturbance introduced while conducting cell operations (e.g. program, erase, and read) throughout other cells that are within a same memory array. As will be described herein, the cell of prior art band structure is prone to these types of disturb problems. These program disturb and erase disturb problems can however be avoided with the memory cell of the present invention.

Program Disturb

Program disturb can happen in an unselected memory cell in a memory array. The worse case for program disturb corresponds to the situation when FG 18 of the unselected cell is positively charged (e.g. in the erased state). FIG. 7A illustrates the energy band diagram corresponding to this situation in memory cell of the present invention, wherein a voltage for the program disturb is assumed to be about −2 V from TG 10 to BG 14. For preventing program disturb, there are four barrier heights provided that are relevant to the blocking of the valence electrons 42 (VE) in TG 10 from transporting along the forward direction. A first one is a barrier height 50 ($\Delta\Phi_{VE\_TT}$), which corresponds to the barrier height seen by VE 42 in TG 10 at the interface of TG 10 and TD 11. A second one is a barrier height 60 ($\Delta\Phi_{VE\text{-}TTB}$) and is the barrier height seen by VE 42 at the interface of TD 11 and BD 12. The barrier height 60 ($\Delta\Phi_{VE\_TTB}$) relates to the barrier height 50 ($\Delta\Phi_{VE\_TT}$) through formula:

$$\Delta\Phi_{VE\_TTB}=\Delta\Phi_{VE\_TT}-|V_{TD}|,$$

where $V_{TD}$ is the voltage across TD 11 when the voltage of program disturb is applied between TG 10 and BG 14. These two barrier heights form a trapezoidal barrier in TD 11 with the barrier height 50 at the entrance side and the barrier height 60 at the exit side when viewed from the incoming electrons 42.

Similarly, a third one is a barrier height 54 ($\Delta\Phi_{VE\_TB}$), which corresponds to the barrier height seen by VE 42 at the interface of TD 11 and BD 12. A fourth one is a barrier height 61 ($\Delta\Phi_{VE\_TBG}$) and is the barrier height seen by VE 42 at the interface of BD 12 and BG 14. The barrier height 61 ($\Delta\Phi VE_{\_TBG}$) relates to the barrier height 54 ($\Delta\Phi_{VE\_TB}$) through formula:

$$\Delta\Phi VE_{\_TBG}=\Delta\Phi_{VE\_TB}-|V_{BD}|,$$

where $V_{BD}$ is the voltage across BD 12 when the voltage of program disturb is applied between TG 10 and BG 14. The third and the fourth barrier heights here form a trapezoidal barrier in BD 12 with the barrier height 54 at the entrance side and the barrier height 61 at the exit side of the barrier for the incoming electrons 42.

Figure 7B:
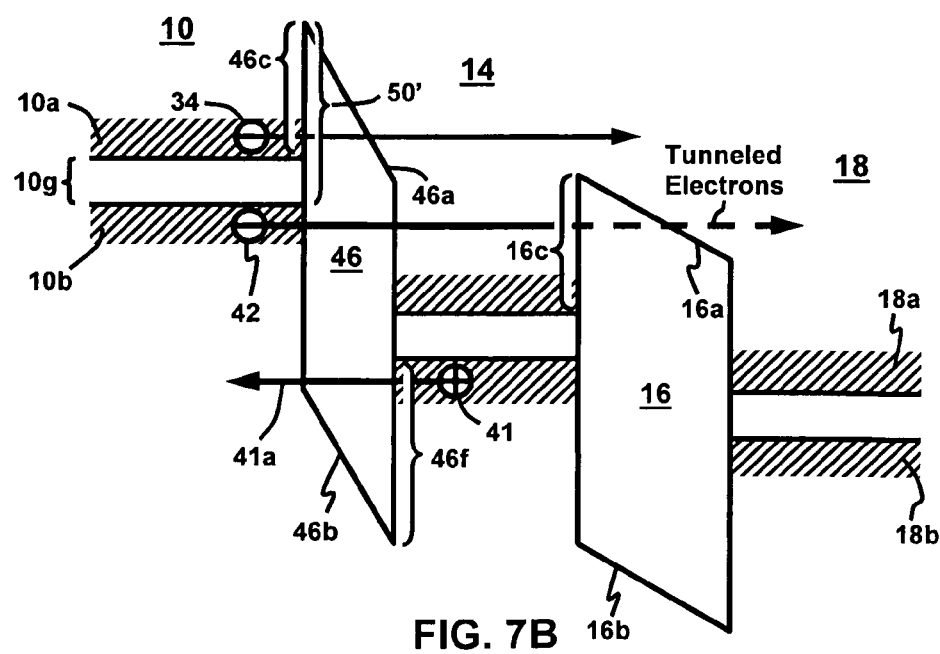
FIG. 7B is the energy band diagram of the cell structure of FIG. 4, illustrating weakness on barrier heights for blocking charges transport when biasing the cell under the condition of program disturb prevention.

Similar diagram on energy band as shown in FIG. 7A is illustrated in FIG. 7B for prior art energy band for comparison. In FIG. 7B, there is shown a barrier height 50', which corresponds to the barrier height for VE 42 at the interface of TG 10 and insulator 46. Under the bias for disturb prevention, the VE 42 is shown be able to transport through insulator 46 in direct tunneling mechanism and can reach the interface between BG 14 and RD 16. When employing prior art band structure in a memory cell, the disturb prevention thus fully relies on keeping the energy level of VE 42 lower than the barrier height 16c ($\Delta\Phi_{CB\_GR}$) to permit RD 16 as the barrier blocking the incoming electrons from entering FG 18, and hence to prevent a disturb event. However, there are situations that these electrons can enter into FG 18 through tunneling into the conduction band 16a of RD 16 in Fowler-Nordheim tunneling mechanism when RD 16 has an triangle-shaped energy band structure shown in FIG. 7B. In such an event, a change on cell state can occur as enough electrons are inadvertently introduced and accumulated on FG 18. This effect results in a cell disturb. Also shown in FIG. 7B is the conduction electrons 34 (CE) in the p+ polysilicon TG 10 with a barrier height 46c ($\Delta\Phi_{CB\_TT}$) illustrated as the barrier height associated thereto. CE 34 in a p+ polysilicon is usually negligible in normal voltage range (e.g. ~2V) and can become significant in higher voltage (e.g. ~3V) when the p+ polysilicon is inverted. FIG. 7B shows that CE 34 can be inadvertently injected into FG 18, even the cell is biased under condition for preventing a program disturb. The cumulative disturbance introduced by this effect can also result in a cell disturb in cell of prior art energy band.

With the barrier height engineering concept, the energy band constructed in the present invention provides a more effective structure on preventing the program disturb than that in the prior art energy band. Referring back to FIG. 7A, the trapezoidal barrier formed in BD 12 provides an additional blocking barrier to the incoming electrons 42. The barrier heights 54 and 61 can be optimized by a proper selection on the dielectric constant and thickness for TD 11 and BD 12, as taught in the theory for barrier height engineering, such that they can be electrically altered in different degree than the barrier heights 50 and 60 of TD 11. In general, it is desired to keep the two barrier heights 54 and 61 of the trapezoidal barrier high enough to block the electrons 42 in VB 10b of TG 10. For disturb prevention, the voltage between TG 10 and BG 14 is chosen such that the energy level of electrons in TG 10 is under the barrier heights 54 and 61. It should be noted that the trapezoidal barrier in BD 12 can be preserved by keeping a positive value for the barrier height 61 (i.e. the one at the exit side). This can be achieved by choosing a large value for the conduction band offset 12c ($\Delta\Phi_{CB\_TB}$) between TG 10 and BD 12 through proper selection on materials for TD 11 and BD 12 or by keeping $V_a$ at a value lower than the summation of the barrier height 12c, the flatband voltage $V_{fb}$, and energy band gap Eg 10g. A better way to capture the method provided here for disturb prevention is by referring to the expression for the barrier height 61 ($\Delta\Phi_{VE\_TBG}$) described earlier, which can be further expressed as $$\Delta\Phi_{VE\_TBG} = \Delta\Phi_{CB\_TB} + Eg - (V_a - V_{fb}).$$

As is clear mathematically in this formula, keeping a $V_a$ lower than the summation of $\Delta\Phi_{CB\_TB}$, Eg, and $V_{fb}$, can keep the barrier height 61 ($\Delta\Phi_{VE\_TBG}$) having a positive height, thus can preserve the trapezoidal barrier shape. For the specific embodiment, TG 10 voltage is chosen in the range of about −1.0 V to about −2.0 V relative to BG 14 voltage for program disturb prevention.

As described hereinbefore, the barrier height engineering permits a portion of $V_a$ be dropped across BD 12 region. Therefore, the voltage across TD 11 ($V_{TD}$) is lower than that in the insulator 46 of cell of prior art energy band. A lower $V_{TD}$ can prevent the formation of CE 34 in the p+ polysilicon of TG 10, and hence prevents program disturb caused by the higher energy CE. In the situation where CE 34 does get formed in TG 10, program disturb of CE can be suppressed by keeping the two barrier heights, 54 and 61, of the trapezoidal barrier high enough such that CE 34 is blocked from tunneling through TD 11 and BD 12. This can be done through optimizing the barrier structure, as taught in the barrier height engineering theory.

Erase Disturb

Figure 8A:
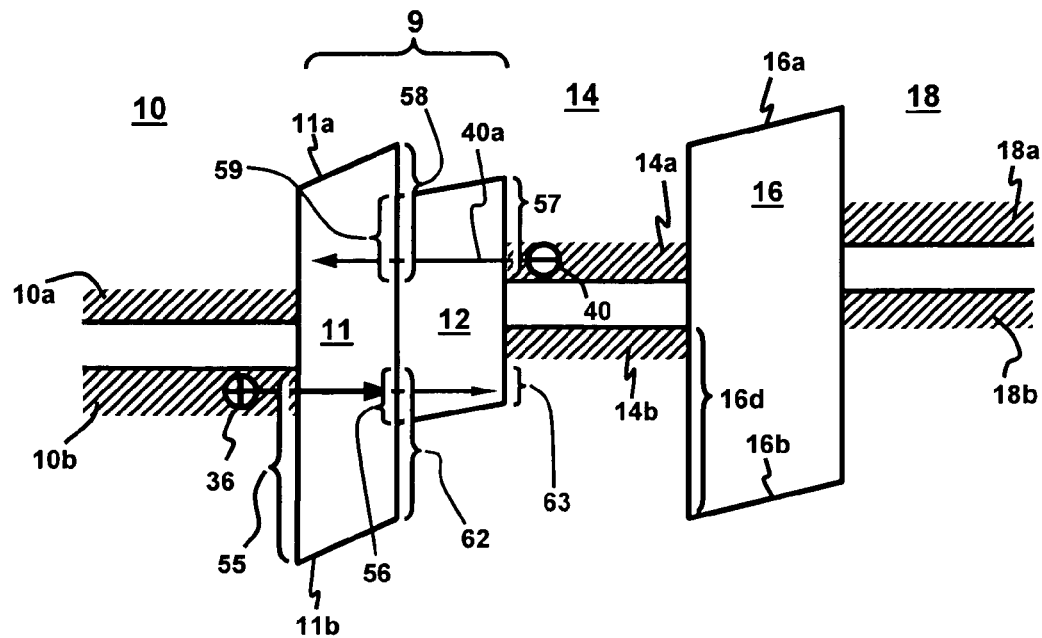
FIG. 8A is the energy band diagram of the structure of FIG. 1A, illustrating various barrier heights for blocking charges transport when biasing cells of the present invention under the condition of erase disturb prevention.

The worse case for erase disturb on an unselected memory cell in a memory array corresponds to the situation when FG 18 of the unselected cell is negatively charged (e.g. in the programmed state). FIG. 8A illustrates the energy band diagram corresponding to this situation, wherein a voltage for erase disturb is assumed to be about +2 V from TG 10 to BG 14. To prevent erase disturb, there are four barrier heights provided in the energy band structure of the present invention for blocking holes 36 in TG 10 from transporting along the forward direction. The first one is barrier height 55 ($\Delta\Phi_{VH\_TT}$), which corresponds to the barrier height seen by holes 36 at the interface of TG 10 and TD 11. The second one is barrier height 62 ($\Delta\Phi_{VH\_TTB}$) and is the barrier height seen by holes 36 at the interface of TD 11 and BD 12. The barrier height 62 ($\Delta\Phi_{VH\_TTB}$) relates to the barrier height 55 ($\Delta\Phi_{VH\_TT}$) through formula:

$$\Delta\Phi_{VH\_TTB} = \Delta\Phi_{VH\_TT} - |V'_{TD}|,$$

where $V'_{TD}$ is the voltage across TD 11 during the erase disturb. These two barrier heights form a valence band trapezoidal barrier in TD 11 with the barrier height 55 at the entrance side and the barrier height 62 at the exit side of the barrier for the incoming holes 36. Similarly, the third one is barrier height 56 ($\Delta\Phi_{VH\_TB}$), which corresponds to the barrier height seen by holes at the interface of TD 11 and BD 12. The fourth one is barrier height 63 ($\Delta\Phi VH_{TBG}$) and is the barrier height seen by holes 36 at the interface of BD 12 and BG 14. The barrier height 63 ($\Delta\Phi_{VH\_TBG}$) relates to the barrier height 56 ($\Delta\Phi_{VH\_TB}$) through formula:

$$\Delta\Phi_{VH\_TBG} = \Delta\Phi_{VH\_TB} - |V'_{BD}|,$$

where $V'_{BD}$ is the voltage across BD 12 during the erase disturb. These two barrier heights form a trapezoidal barrier in BD 12 with the barrier height 56 at the entrance side and the barrier height 63 at the exit side of the barrier for the incoming holes 36.

Figure 8B:
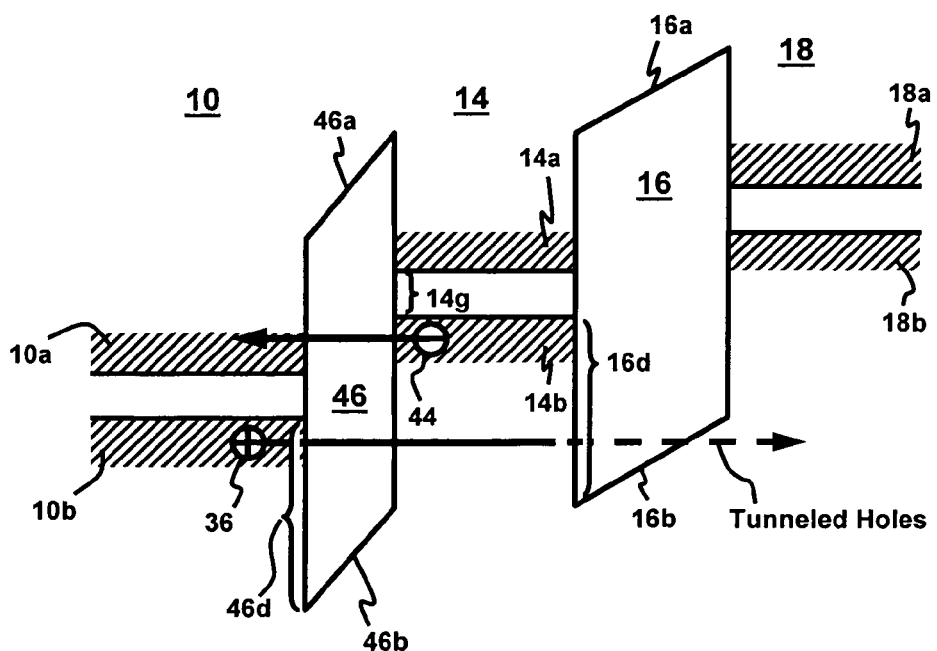
FIG. 8B is the energy band diagram of the cell structure of FIG. 4, illustrating weakness on barrier heights for blocking charges transport when biasing the cell under the condition of erase disturb prevention.

A similar diagram on energy band as shown in FIG. 8A is illustrated in FIG. 8B for prior art energy band for comparison. In FIG. 8B, there is shown a barrier height 46d, which corresponds to the barrier height for holes 36 at the interface of TG 10 and insulator 46. Under the bias condition for disturb prevention, holes are shown be able to transport through insulator 46 in direct tunneling mechanism and can reach the interface between BG 14 and RD 16. When such band structure is used for memory cell, the disturb prevention for such cell rely on RD 16 as the barrier blocking the incoming holes from entering FG 18. Therefore, keeping the energy level of holes lower than the barrier height 16d ($\Delta\Phi_{VB\_GR}$) is essential in order to prevent a disturb event. However, there are situations (e.g. in a fully programmed cell) that these holes can enter into FG 18 through tunneling into the valence band 16b of RD 16 in Fowler-Nordheim tunneling mechanism when RD 16 has an "triangle-shaped" energy band structure shown in FIG. 8B. In such an event, a change on cell state can occur as enough holes are inadvertently introduced and accumulated on FG 18. This results in an erase disturb to an unselected cell. Thus cell of prior art energy band is more vulnerable to disturb issue.

With the barrier height engineering concept, the energy band constructed in the present invention provides a more effective structure preventing the erase disturb in the memory cell. Referring back to FIG. 8A, the trapezoidal barrier formed by BD 12 provides a more effective structure to block the incoming holes. The barrier heights 56 and 63 can be optimized by a proper selection on the dielectric constant and thickness for TD 11 and BD 12, as taught in the theory for energy band engineering, such that they can be electrically altered in different degree than the barrier heights 55 and 62 of TD 11. In general, it is desired to keep the two barrier heights, 56 and 63, of the trapezoidal barrier high enough in unselected cells for disturb prevention, and to keep such two barriers low enough in selected cells for erase operation. For disturb prevention, the voltage between TG 10 and BG 14 is chosen such that the energy level of holes 36 is lower than the barrier heights 56 and 63. It should be noted that the trapezoidal barrier in BD 12 can be preserved by keeping a positive value for the barrier height 63 (i.e. the one at the exit side). This can be achieved by choosing a large value for the valence band offset 12d ($\Delta\Phi_{VB\_TB}$) between TG 10 and BD 12 in FIG. 1B through proper selection on materials for TD 11 and BD 12 or by keeping $V_a$ at a value lower than the summation of the valence band offset 12d ($\Delta\Phi_{VB\_TB}$) and the flat band voltage $V_{fb}$. A better way to capture the method provided here for disturb prevention is by referring to the formula for the barrier height 63 ($\Delta\Phi_{VH\_TBG}$), which is expressed as $$\Delta\Phi_{VH\_TBG}=\Delta\Phi_{VB\_TB}-(V_a-V_{fb}).$$

As is clear mathematically in this formula, keeping $V_a$ greater than the summation of $\Delta\Phi_{VB\_TB}$ and $V_{fb}$ can keep the barrier height 63 ($\Delta\Phi_{VH\_TBG}$) having a positive height, thus can preserve the trapezoidal barrier shape.

For the specific embodiment, TG 10 voltage is chosen in the range of about +2.0 V to about +2.5 V relative to BG 14 voltage for erase disturb prevention.

Figure 9:
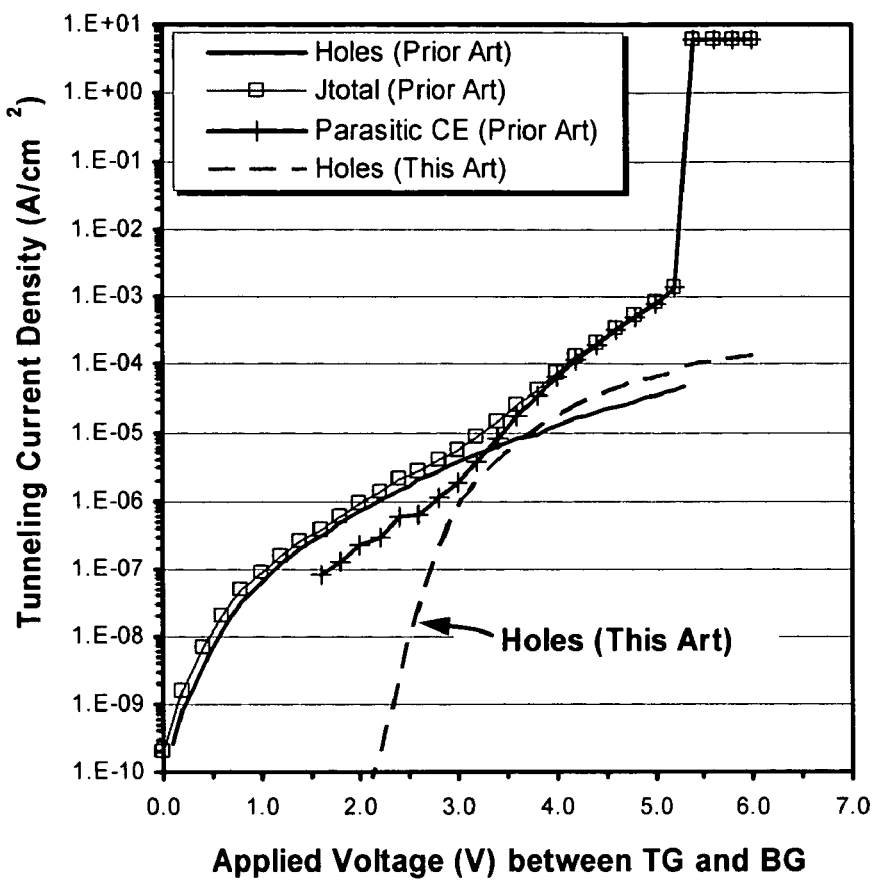
FIG. 9 is a chart illustrating the tunneling current density of various current components as a function of voltage across the TG and the BG electrodes, and further illustrating the difference on these components between cells having filter (this art) and having plain injector (prior art)

FIG. 9 illustrates the effect of the barrier height engineering on tunneling currents when TG 10 is positively biased relative to BG 14. The tunneling currents of prior art energy band (plain injector) comprise the hole current in the modest bias range (0 to 3 V) and the parasitic CE current in the higher bias range (3V and higher). As described hereinbefore (see FIG. 5B), the CE current is from the inversion layer formed in BG 14, which is formed of p+ polysilicon. The CE current constitutes a major problem on functionality of memory cell of prior art energy band. In a clear contrast, the total tunneling current of the cell having filter (this art) is found comprising the hole current only. There is no parasitic current observed within the entire bias range. The parasitic CE problem is prevented in memory cell of the present invention because of the voltage divider function provided by the filter. Furthermore, the hole current of this art show a much stronger voltage dependence than that in the prior art. As illustrated, the hole current is found at similar level as that in prior art at the erase voltage of about 5V, and is found negligible at a disturb prevention voltage of about 2 V. As is shown for an applied voltage of 2V, the hole current density of this art is about $10^4$ times lower than that of prior art. In other words, with the barrier height engineering and the band structure provided in the present invention, the memory cell thus constructed can have an erase disturb strength about $10^4$ times stronger than that of cell constructed in prior art energy band.

Figure 10A:
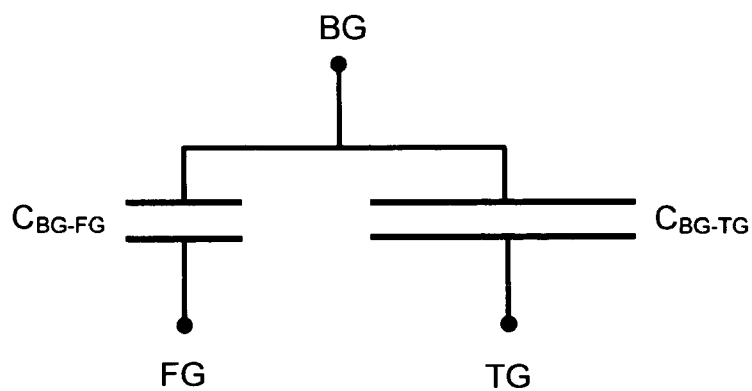
FIG. 10A illustrates various parasitic capacitances associated with the ballistic gate of the memory cell.

FIG. 10A illustrates the parasitic capacitances associated with BG 14 in the overlap region. $C_{BG-TG}$ is the capacitance between BG 14 and TG 10, and $C_{BG-FG}$ is the capacitance between BG 14 and FG 18.

Figure 10B:
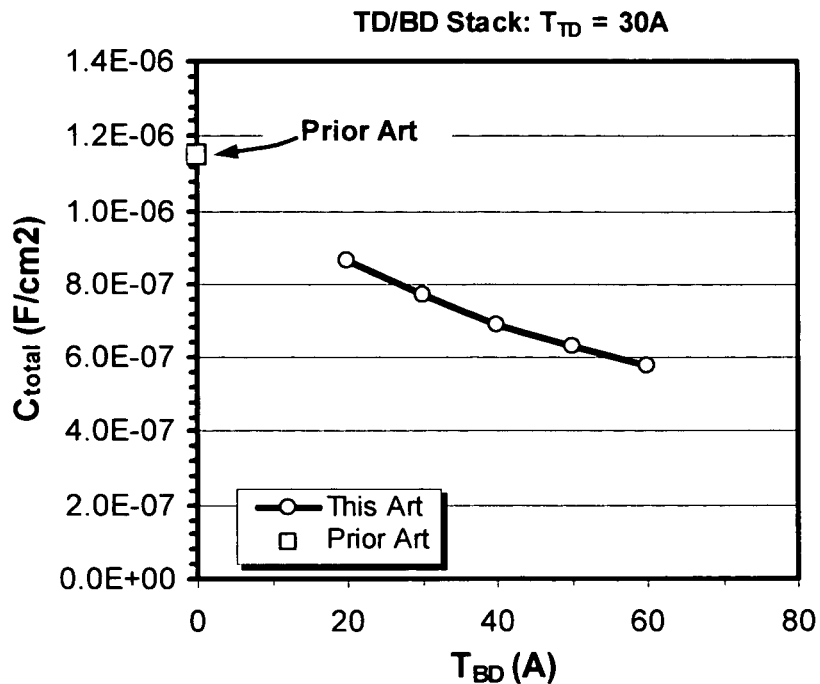
FIG. 10B is a chart illustrating the total capacitance seen by BG electrode for cell structures having filter (this art) and having plain injector (prior art); wherein the total capacitance for structure of the filter type is illustrated can be significantly lowered with a proper selection on the BD thickness.
Figure 10C:
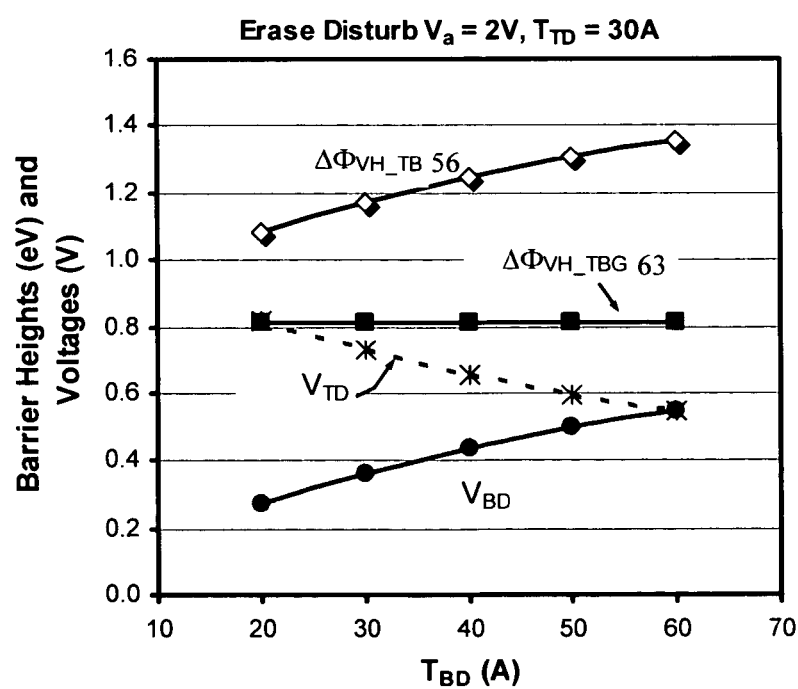
FIG. 10C is a chart illustrating the effect of thickness of the blocking dielectric on barrier heights and on voltages across the tunneling and the blocking dielectrics, and further illustrating there is no compromise between optimizing barrier heights for disturb prevention and optimizing BD thickness for capacitance suppression.

FIG. 10B illustrates the advantage on suppressing parasitic capacitance as provided in the present invention. As required by tunneling injection, the thickness of insulator 46 of the plain injector cell is typically around 30 Å. The corresponding parasitic capacitance between TG 10 and BG 14 is about $1.2\times10^{-6}$ Farad/cm$^2$. In the present invention, such capacitance can be significantly reduced to the range of about $9\times10^{-7}$ Farad/cm$^2$ for structure having filter with BD thickness at around 20 Å. The capacitance can be further reduced to the range of about $7\times10^{-7}$ and $5.8\times10^{-7}$ Farad/cm$^2$ as thickening BD to 40 Å and 60 Å, respectively. It should be noted that thickening BD does not have adverse impacts on disturb prevention for program and for erase. This can be better understood by referring to the expression for the barrier height 63 ($\Delta\Phi_{VH\_TBG}$) for erase and the barrier height 61 ($\Delta\Phi_{VE\_TBG}$) for program. For the case of erase, as is apparent in the expression for $\Delta\Phi_{VH\_TBG}$ (=$\Delta\Phi_{VB\_TB}-(V_a-V_{fb})$), the barrier height of $\Delta\Phi_{VH\_TBG}$ 63 is independent of the thickness of BD 12, and hence thickening BD 12 will not change the barrier height 63. As described in connection with FIG. 8A, keeping a positive barrier height 63 can preserve the valence band barrier of BD 12 in a trapezoidal shape, which is important for blocking tunneling charge carriers. The effect here is advantageous as it permits the optimization on the barrier height 63 for disturb prevention and the optimization on BD 12 thickness for parasitic capacitance suppression be made separately. Therefore, there is no compromise in the optimization processes. In fact, thickening BD 12 can permit the trapezoidal barrier be a more effective tunneling barrier to charge carriers on either side of the barrier due to a thicker tunneling distance for these carriers. Furthermore, a thicker BD 12 permits a larger voltage drop across BD 12, and hence a smaller voltage drop across TD 11. The effect of the thickness of BD 12 on barrier heights and on voltage drop across the dielectrics is illustrated in FIG. 10C for the erase disturb. The illustration is made for the specific embodiment, where nitride and oxide is employed as the material for BD 12 and TD 11, respectively. As is apparent, the barrier height 63 ($\Delta\Phi_{VH\_TBG}$) is found independent of BD (nitride) thickness, and is maintained at a value of about 0.8 eV when $V_a$ is set at 2V for disturb prevention. As also shown in FIG. 10C, thickening BD 12 results in a higher barrier height 56 ($\Delta\Phi_{VH\_TB}$). As can be seen in FIG. 8A, a higher barrier height 56 is favorable for blocking the holes from forward tunneling, and hence is desirable for disturb prevention Same analysis can be made to illustrate the effects for program disturb as that made for the erase case.

In the cell of prior art energy band, material with a larger work function is one of the major criteria on material selection for BG 14. The barrier height engineering scheme of the present invention removes this constraint totally, and the material for BG 14 can be any kind of conductive materials. To emphasize this effect, the present invention is illustrated by choosing material of a smaller work function, namely, n+ polysilicon, for BG 14. It should be apparent to those of ordinary skill in the art that the material for BG 14 in present invention is not limited to n+ polysilicon, but can encompass any other type of conductive materials such as p+ polysilicon, polycrystalline Silicon-Germanium ("poly SiGe"), platinum (Pt), Au, Tungsten (W), Molybdenum (Mo), ruthenium (Ru), tantalum (Ta), tantalum nitride (TaN), titanium nitride (TiN) etc.

It should be noted that the dielectric constant of BD 12 is illustrated to be greater than that of TD 11. It should be clear to those of ordinary skill in the art that the teaching of this disclosure can be applied to modify the BD 12 layer to material having dielectric constant similar to that of TD 11 to effectively block the parasitic charge carriers (electrons or holes) from backward tunneling. Furthermore, the layer of BD 12 need not be a material with a uniform chemical element but can be a material with graded composition on its element. In addition, any appropriate dielectric, such as oxynitride ("SiON"), aluminum oxide ("$Al_2O_3$"), hafnium oxide ("$HfO_2$"), zirconium oxide ("$ZrO_2$"), tantalum pen-oxide ("$Ta_2O_5$") etc. can be used in place of oxide or nitride. Furthermore, any composition of those materials and the alloys formed thereof, such as hafnium oxide-oxide alloy ("$HfO_2$—$SiO_2$"), hafnium-aluminum-oxide alloy ("HfAlO"), hafnium-oxynitride alloy ("HfSiON") etc. can be used in place of oxide or nitride.

It is to be understood that the present invention is not limited to the illustrated herein and embodiments described above, but encompasses any and all variations falling within the scope of the appended claims. For example, although the present invention is illustrated in EEPROM, it should be apparent to those having ordinary skill in the art that it can be extended to any other type of nonvolatile memories (such as Electrical Programmable Memory or EPROM). Furthermore, the present invention is illustrated in non-volatile memory cell storing charges on a storage region of a conductive or semiconductor material (i.e. the "floating-gates") that is electrically insulated from but capacitively coupled to surrounding electrodes. In such storage scheme, charges are evenly distributed through out the conductive region. However, it should be apparent to those of ordinary skill in the art that the present invention is not limited to the illustrated herein and embodiments described above, but can encompass any other type of schemes for storing charges. For example, the memory cells of the present invention can store charges in localized storage sites such as nano-particles or traps in a dielectric layer. The advantage of these charge storing schemes is a negligible interference between adjacent cells when they are arranged in a memory array. Furthermore, in the event there is a local breakdown in surrounding insulators of one of the storage sites, charges stored at other sites can still be retained. The dielectric having traps as the storage sites can be a nitride layer formed, for example, by using LPCVD (Low-Pressure-Chemical-Vapor-Deposition) technique well-known in the art. Other dielectrics such as $HfO_2$ and $ZrO_2$ having traps of a deeper trapping energy can also be considered as material for the trapping dielectric. The nano-particles as the storage sites can be silicon nano-crystals each in an oval shape having a diameter in the range of about 2 nm to about 7 nm, and can be formed by using well-known CVD technique. The nano-particles are not limited to the silicon but can be of any other type of materials (e.g. Ge, SiGe alloy, $HfO_2$, Au, Co, and W etc.) that can effectively store charges.

Additionally, although the present invention is illustrated in a single cell, it should be apparent to those of ordinary skill in the art that a plurality of cells of the present invention can be arranged in an array of rows and columns of a NAND or NOR array architecture well known in the art.

Moreover, the floating gate (or the charge storage region) of the present invention need not be in rectangular shape in their cross-sections or their top view, but rather can be any size and shape in their cross-sections and top view that effectively store charges and effectively connects the drain 26 and source 22 regions in each memory cell. Additionally, the top surface portion of the charge storage region need not be co-planar with the substrate surface, but rather can be at any level under or above the substrate surface that permit the storage region to effectively store charges, effectively capacitive-coupled with BG 14 and the body 28, and effectively connects the drain 26 and source 22 regions in each memory cell. Similarly, the bottom surface portion of the charge storage region need not be parallel to the substrate surface, need not be flat, but rather can be with other shape that permit storage region to effectively store charges, effectively capacitive-coupled with BG 14 and the body 28, and effectively connects the drain 26 and source 22 regions in each memory cell. Likewise, the top and the bottom surface portion of TD 11 and BD 12 need not be parallel to the substrate surface, need not be flat, need not be co-planar with the substrate surface, but rather can be at any level under or above the substrate surface, in any angle with the substrate surface, and with other shape that can effectively permit charge carriers tunneling in the forward direction and blocked in the backward direction. Additionally, the surface of the channel region need not be co-planar with the substrate surface, but rather can be at any level under or above the substrate surface or in any angle with the substrate surface that effectively connects the drain 26 and source 22 regions in each memory cell. Moreover, source 22 and drain 26 regions can be swapped. It should be understood that while the figures show the body in the substrate, it is well known that any and/or all of the regions formed therein (source, drain, channel region etc.) can be formed in one or more well regions (of differently doped silicon).

It should be clear to those of ordinary skill in the art that the teachings of this disclosure can be applied to modify the architecture of the filter through which the effects resulting in the above advantages can be achieved.

Embodiment 200

Figure 11A:
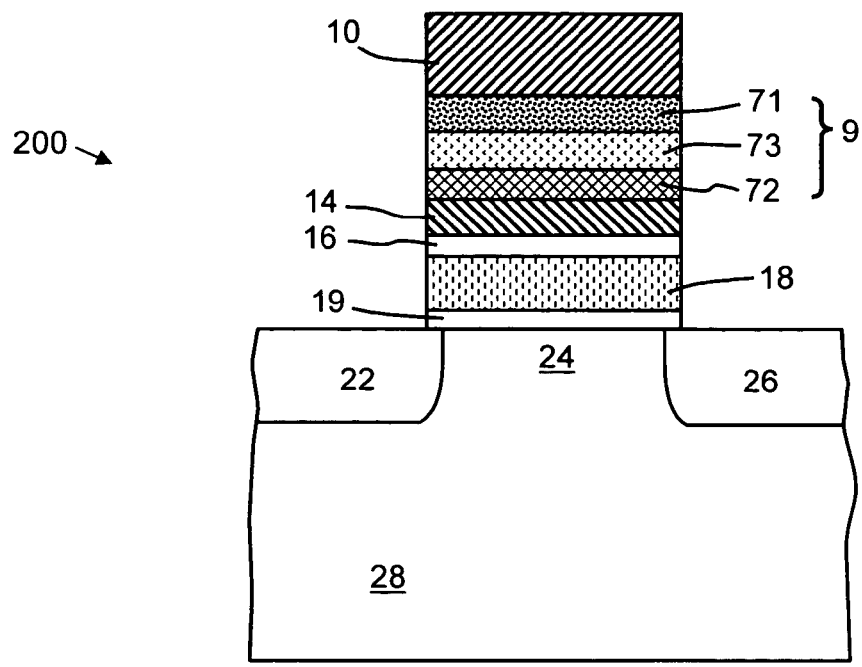
FIG. 11A is the cross sectional view of the cell structure for another embodiment of the present invention.
Figure 11B:
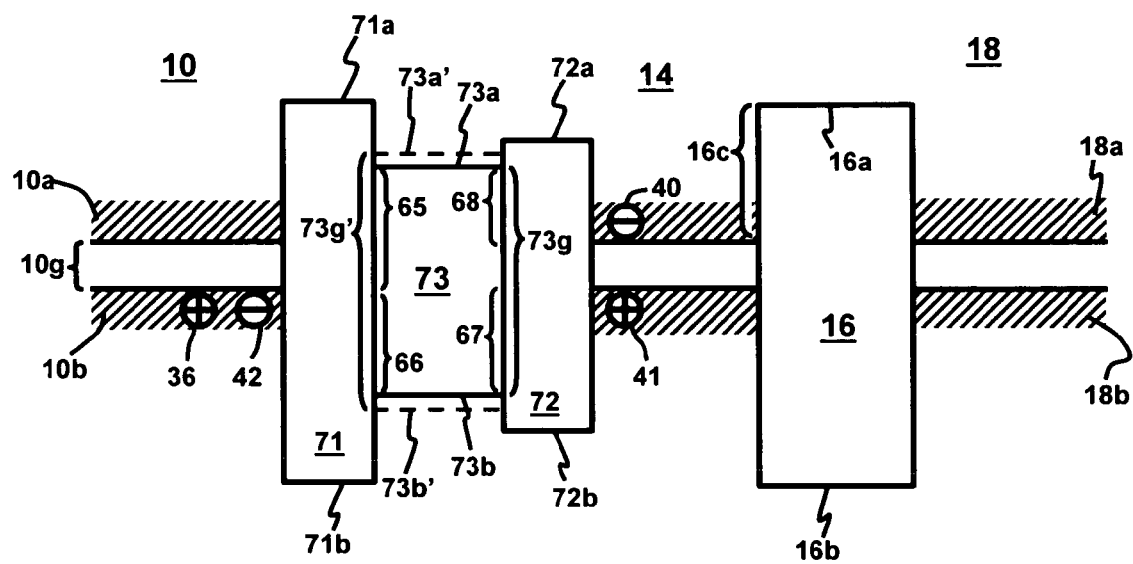
FIG. 11B illustrates the energy band diagram in the flat-band condition for the memory cell structure of FIG. 11A of the present invention.

FIGS. 11A and 11B provide respectively a cell structure 200 and an energy band diagram in the flat-band condition for another embodiment of the present invention. The memory cell 200 of FIG. 11A is similar to the one illustrated in FIG. 1A except with a difference on the filter 9 structure in between TG 10 and BG 14. These differences are described herein. Referring to FIG. 11A, there is shown a filter 9 comprising an upper tunneling dielectric (UTD 71), a lower tunneling dielectric (LTD 72), and a blocking material (BM 73) disposed therebetween. The UTD 71 can be a dielectric material such as oxide or any other materials considered in connection with TD 11 of cell 100. The LTD 72 can be a dielectric having a lower energy gap and a higher dielectric constant than that of UTD 71. In general, the materials for UTD 71 and LTD 72 should be high quality dielectrics permitting charge carriers to transport therethrough from one side of the dielectric to the other in quantum mechanical tunneling mechanisms. Nitride formed in RTN is known to provide such type of quality and can be a good candidate for LTD 72. Other material, such as oxynitride, considered in connection with BD 12 of cell 100 can also be considered for LTD 72. The thickness of UTD 71 and LTD 72 can be in similar range as that of TD 11 and BD 12, respectively, described in connection with cell 100 of FIG. 1A. The blocking effect of BD 12 for the filter 9 of FIG. 1A is now functioned by BM 73, as will be described in detail below.

The blocking material 73 can be a semiconductor material or an insulating dielectric having an energy gap 73g (referring to FIG. 11B) in the range of about 1 eV to about 6 eV. The blocking material provides a blocking effect on charge carriers (electrons or holes) emitted either from TG 10 or from BG 14 regions when the Fermi level of these regions lie within the energy band gap 73g of the blocking material. This is because there are no available energy states in BM 73 through which charge carriers can tunnel. The blocking material becomes transparent to these emitted charge carriers as the Fermi levels of TG 10 and BG 14 are shifted out of the energy band gap 73g of BM 73 when proper bias is applied between TG 10 and BG 14. If semiconductor is considered as the material for BM 73, Silicon Carbide (SiC) can be a good choice due to its wider energy gap (e.g. 3.25 eV and 2.85 eV for 4H—SiC and 6H—SiC, respectively). Other materials having an energy band gap of similar range and is compatible to state of the art IC technology, can be also the material of choice for BM 73. To effectively block charge carriers tunneling through BM 73 from both the forward and the backward directions, it is desirable that the materials for TG 10, BM 73, and BG 14 are properly chosen such that TG 10 and BG 14 have their work functions with a Fermi level in the flat band condition lie in approximately the middle of the energy band gap 73g of BM 73. This can be best understood if choosing 4H—SiC as an illustration. Assuming both TG 10 and BG 14 have work functions with a Fermi level lie in the middle of energy band gap 73g of BM 73, the blocking effect of BM 73 thus take effect when voltage across TG 10 and BG 14 is less than about 1.5 V. For voltage with an absolute value greater than about 1.5V, charge carriers are permitted to transport across BM 73 regions through tunneling.

When a semiconductor material is used for BM 73, the thickness of BM 73 is desired to be in the range comparable to or thicker than the wavelength of charge carriers (i.e. electrons or holes), and can be in the range of about 100 Å to about 300 Å. BM 73 with thickness of this range is considered to have a continuum of energy levels for charge carriers above the conduction and valence band edges, 73a and 73b, respectively (referring to FIG. 11B). For BM 73 with thickness shorter than the wavelength of electrons, the conduction bands of UTD, BM, and LTD (71a/73a/72a) can form a band structure with a quantum energy-well in the conduction band of BM 73 region. The energy level of the electrons in the quantum well is quantized to discrete energy levels such that the lowest level (or the first level) 73a' is raised to a level higher than the conduction band 73a of BM 73. Likewise, a quantum well of valence band can be formed in the BM 73 region by the valence bands of UTD/BM/LTD 71b/73b/72b. Similar to the effect of conduction band quantum well on electrons, the valence band quantum well can quantize the hole energy into discrete levels with its first level 73b' higher in hole energy than the valence band 73b of BM 73. This quantum well effect has the advantage on widening the "effective" energy gap 73g' from the original gap 73g for blocking charge carriers tunneling therethrough. Therefore, it extends the range on blocking unwanted charges for the blocking material 73.

In FIG. 11B, there are shown barrier heights 65 ($\Delta\Phi_{VE\_TBm}$), 66 ($\Delta\Phi_{VH\_TBm}$), 67 ($\Delta\Phi_{VH\_GBm}$) and 68 ($\Delta\Phi_{CE\_GBm}$). The barrier height 65 functions a similar role as that of the barrier height 54 ($\Delta\Phi_{VE\_TB}$) in FIG. 7A, which is to block VE carriers 42 tunneling from TG 10 to BG 14 during program disturb prevention (assuming p-type poly for TG 10). Likewise, the barrier height 66 ($\Delta\Phi_{VH\_TBm}$) functions a similar role as that of the barrier height 56 ($\Delta\Phi_{VH\_TB}$) in FIG. 8A, which is to block hole carriers 36 tunneling from TG 10 to BG 14 during erase disturb prevention. Furthermore, the barrier height 67 ($\Delta\Phi_{VH\_GBm}$) functions a similar role as the barrier height 51 ($\Delta\Phi_{VH\_GB}$) in FIG. 7A to block hole carriers 41 tunneling from BG 14 to TG 10 for backward tunneling prevention. Likewise, the barrier height 68 ($\Delta\Phi_{CE\_GBm}$) functions a similar role as the barrier height 57 ($\Delta\Phi_{CE\_GB}$) in FIG. 8A, and is to block CE carriers 40 tunneling from BG 14 to TG 10 for backward tunneling prevention. The barrier heights 65, 66, 67, and 68 can be altered by the voltage between TG 10 and BG 14 in a similar way as described in the barrier heights engineering theory. Therefore, the structure of UTD/BM/LTD 71/73/72 provides an electrically alterable filter which can filter out the unwanted carriers (e.g. the backward tunneling holes) without affecting the transport of the wanted carriers (e.g. the forward tunneling electrons).

The cell 200 can be programmed and erased in similar way as that described in connection with cell 100 of FIG. 1A. While not shown, when a bias is applied between TG 10 and BG 14, there is negligible band bending in BM 73. Furthermore, other barrier heights shown in FIG. 8A can be similar deduced for the energy band structure of FIG. 11B. The advantages of this memory cell structure are similar to the advantages described in connection with cell 100 of FIG. 1A.

Embodiment 300

Figure 12A:
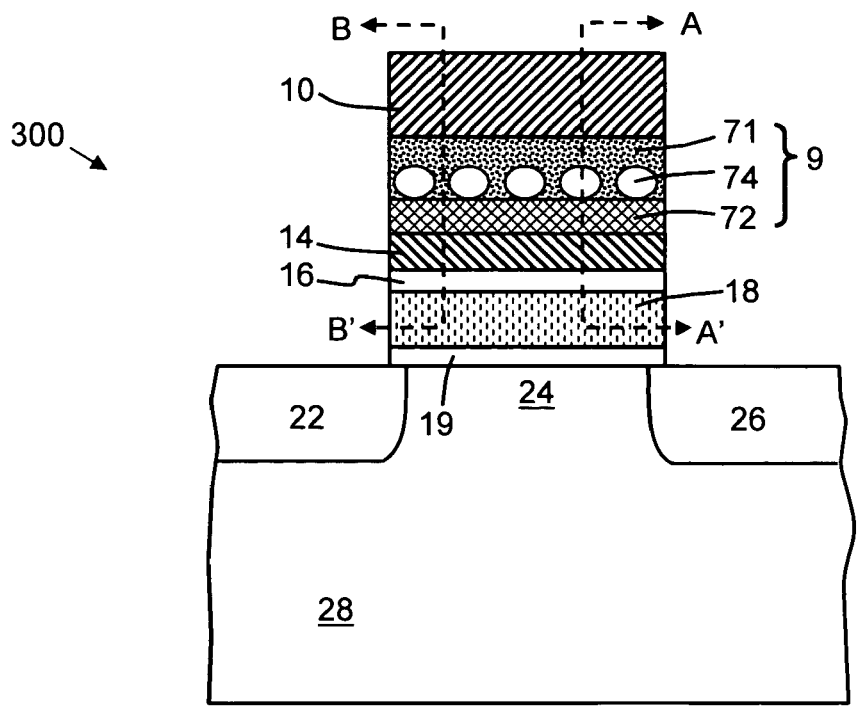
FIG. 12A is the cross sectional view of the cell structure for another embodiment of the present invention.

Provided in FIG. 12A is a similar cell structure as in FIG. 11A except by replacing the BM 73 of FIG. 11A with a plurality of blocking nano-crystals (BNC 74) each having energy gap comparable or larger than that of TG 10. The BNC 74 can be in a ball shape with a diameter in the range comparable to the wavelength of charge carriers (i.e. electrons or holes). Typical range of the diameter is about 30 Å to about 200 Å. The nano-crystals 74 can be formed by Ultra-High-Vacuum Chemical-Vapor-Deposition ("UHVCVD") technique well-known in the art. The nano-crystal functions as an "island" between TG 10 and BG 14 to permit charge carriers hopping therethrough. In specific, as a proper bias is applied between TG 10 and BG 14, charge carriers in TG 10 are emitted through tunneling mechanism onto BNC 74 and subsequently tunneling into the BG 14. The cell structure comprises two types of zone. The first type of zone contains a nano-crystal 74 in between TG 10 and BG 14 (for example along line AA'), whereas the second type of zone does not (for example along line BB'). In this cell structure, charge carriers on TG 10 are permitted to transport to BG 14 only in the first type of zone. Because there is no nano-crystal "island" in the second type of zone, the thickness formed by the UTD 71 and LTD 72 is much thicker for charge carriers tunneling from TG 10 to BG 14. Therefore, charge carriers in TG 10 are prohibited from transporting through the second type of zone to BG 14.

Figure 12B:
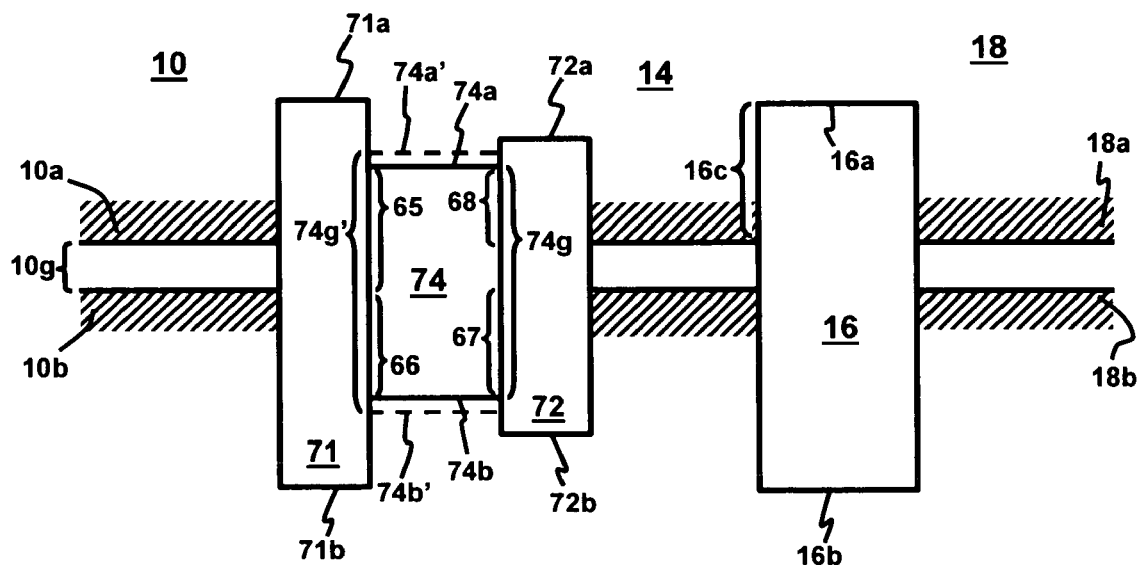
FIG. 12B illustrates the energy band diagram in the flat-band condition for the memory cell structure of FIG. 12A of the present invention, wherein the energy band diagram is along the line AA' of FIG. 12A.

The nano-crystals 74 in between UTD 71 and LTD 72 permits the use of Coulomb blockade effect to the present invention for tunneling injecting wanted carriers (i.e. forward tunneling carriers) while blocking unwanted carriers (i.e. backward tunneling carriers). The Coulomb blocking effect is an effect that can block the transfer of additional electrons (or holes) from transporting from TG 10 through a nano-crystal to BG 14 once there is an electron (or a hole) on the nano-crystal. Further transfer on electron (or hole) is possible only after a further raising on the voltage between TG and BG. Similar barriers heights and their effects on charge carriers blocking as described in connection with FIG. 11B are also provided in the cell 300 of FIG. 12A. This is illustrated in FIG. 12B for the energy band diagram along line AA' of FIG. 12A. BNC 74 having a dimension in the range longer than the wavelength of electrons or holes is considered to have a continuum of energy levels for charge carriers above the conduction and valence band edges, 74a and 74b, respectively (referring to FIG. 12B). For BNC 74 having thickness shorter than the wavelength of electrons, the conduction bands of UTD, BNC, and LTD (71a/74a/72a) can form a band structure with a quantum energy-well in the conduction band of BNC 74. The energy level of the electrons in the quantum well is quantized to discrete energy levels such that the lowest level (or the first level) 74a' is raised to a level higher than the conduction band 74a of BNC 74. Likewise, a quantum well of valence band can be formed in the BNC 74 region by the valence bands of UTD/BNC/LTD 71b/74b/72b. Similar to the effect of conduction band quantum well on electrons, the valence band quantum well can quantize the hole energy into discrete levels with its first level 74b' higher in hole energy than the valence band 74b of BNC 74. This quantum well effect has the advantage on widening the "effective" energy gap 74g' from the original gap 74g for blocking charge carriers tunneling therethrough. Therefore, it extends the range on blocking unwanted charges for BNC 74.

Figure 12C:
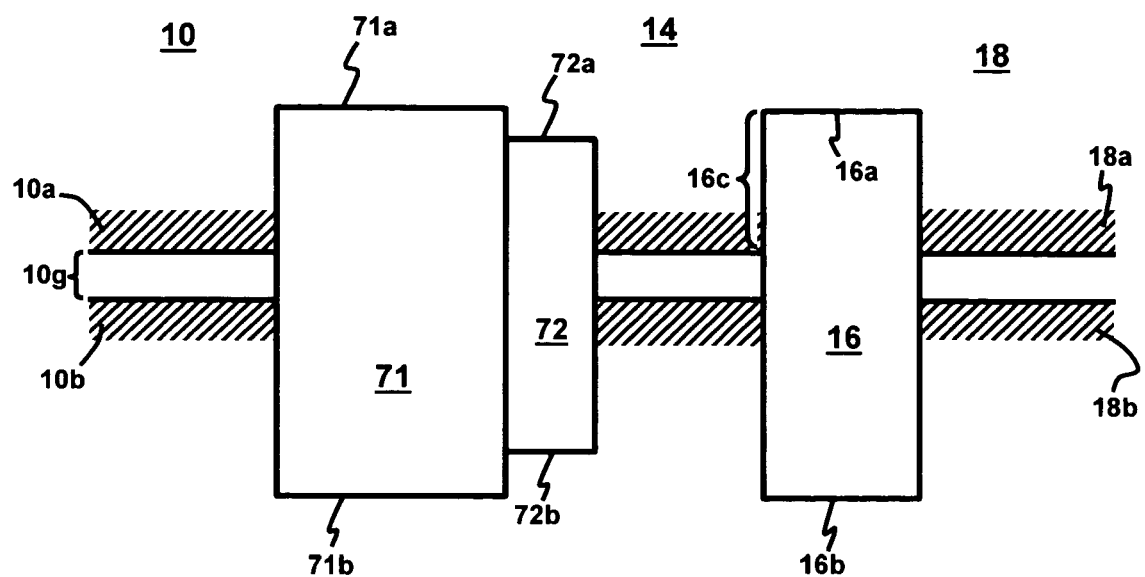
FIG. 12C illustrates the energy band diagram in the flat-band condition for the memory cell structure of FIG. 12A of the present invention, wherein the energy band diagram is along the line BB' of FIG. 12A.

The barrier heights 65, 66, 67, and 68 illustrated in FIG. 12B have identical functions and effects as those shown in FIG. 11B. The cell 300 can be programmed and erased in similar way as that described in connection with cell 100 of FIG. 1A, and contains the advantages demonstrated therein. The cell structure in FIG. 12A further has an advantage on a lower parasitic capacitance of $C_{BG-TG}$ than that of cells 100 and 200 of FIGS. 1A and 11A, respectively. This can be better understood by referring to FIG. 12C, which illustrates the energy diagram for the second type of zone (along line BB' in FIG. 12A). The thicker dielectric thickness between TG 10 and BG 14 along line BB' result in the parasitic $C_{BG-TG}$ from the second type of zone being significantly lower than that from the first type of zone (typically about 5 to 10 times lower). A further reduction on the total parasitic capacitance of $C_{BG-TG}$ from both types of zone can be achieved by reducing the fractional area covered by the nano-crystals 74.

It should be clear to those of ordinary skill in the art that the BM 73 region need not be a conductive material, need not be in rectangular shape in their top view, need not be in rectangular in their cross-sections, but rather can be an insulating dielectric, can be any size and shape in their top view and in their cross-sections that effectively blocks charge carriers from tunneling through at the modest bias range and yet permit the same type of carriers tunneling through at the high bias range. Likewise, the BNC regions need not be in ball shape in their cross section, need not be co-planar with the substrate surface, but rather can be at any level under or above the substrate surface, and with other shape that can effectively block charge carriers tunneling through at the modest bias range while permit the same type of carriers tunneling through at high bias range without holding carriers thereon. Furthermore, the material for BM 73 and for BNC 74 of present invention is not limited to SiC, but can encompass any other type of materials having an energy gap such that TG 10 and BG 14 have their work functions with a Fermi level in the flat band condition lie in approximately the middle of the energy band gap of BM 73 or BNC 74. Moreover, the BNC 74 regions need not be contacting the LTD 72, need not be fully in the UTD 71 region, but rather can be partially in the LTD 72 and partially in the UTD 71 regions, or can be fully in the LTD 72 region.

Embodiment 400

As described hereinbefore, one of the drawbacks in the cell of prior art energy band is the large resistance in BG 14 region due to constraints on its allowable thickness. When polysilicon is used as the material for BG 14, the polysilicon is doped heavily with a p-type of impurity (such as Boron), which acts as an acceptor to supply enough amount of hole carriers in that region, and hence to reduce the sheet resistance of that region. The polysilicon can also be heavily doped with an n-type of impurity (such as Phosphorous) for the same purpose. In such approach, the n-type impurity acts as a donor to supply electron carriers in that region. However, in either approach, while function as the source for supplying carriers, the heavy amounts of impurity also introduce more scattering events between carriers and impurities. Therefore, the sheet resistance can reach a lower limit due to the decrease on carrier mobility caused by the increase on carrier scattering. A provision solving this problem is shown in the embodiment 400 of FIG. 13. The unique structure on energy band gap of FIG. 13 can reduce the sheet resistance of a very thin semiconductor layer, such as BG 14, without suffering the carrier scattering effect.

Figure 13:
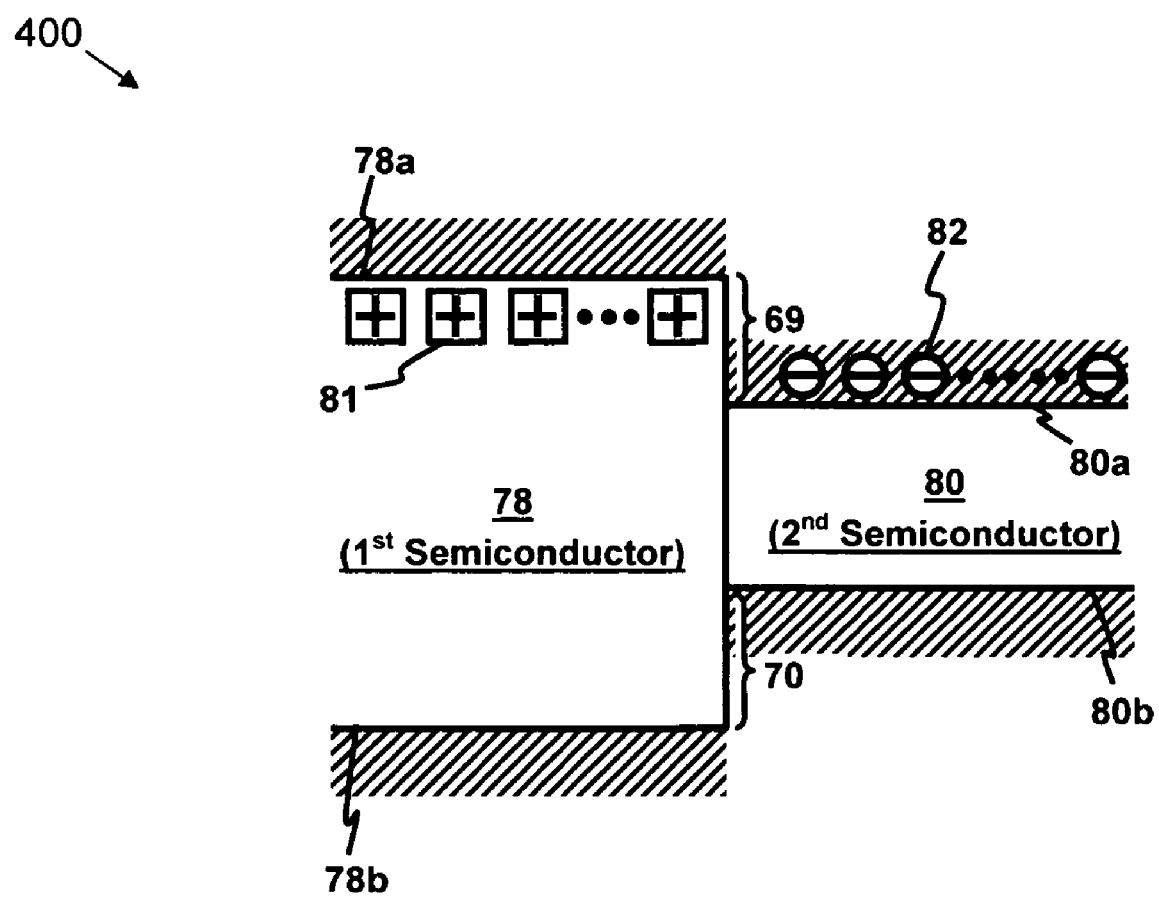
FIG. 13 illustrates the energy band diagram for structure having a first semiconductor material having a wider energy band gap and a second semiconductor material having a narrower energy band gap relative to the first one.

FIG. 13 illustrates the energy band diagram for the unique structure, wherein there is shown a first semiconductor material 78 having a wider energy band gap and a second semiconductor material 80 having a narrower energy band gap relative to the first one. The first semiconductor material 78 is heavily doped with impurity of a p-type or an n-type conductivity, whereas the second semiconductor material 80 is un-doped or lightly doped of same type of conductivity as the first one 78. The conduction band and the valence band offsets between the two regions are shown as $\Delta\Phi_{CB}$ 69 and $\Delta\Phi_{VB}$ 70, respectively. Assuming the first semiconductor 78 is heavily doped with n-type impurities 81 (also termed as "donor impurities"), the electrons in the first semiconductor 78 thus will move toward the second semiconductor 80 to become electrons 82 and be confined therein due to the lower energy level of the conduction band 80a of the second semiconductor 80 than the conduction band 78a of the first semiconductor 78. Since the second semiconductor 80 is un-doped or lightly doped, there is negligible scattering with impurities for electron carriers 82 transporting in that region. Therefore, the sheet resistance of the second semiconductor 80 can be significantly lowered than that for the situation where the second semiconductor is heavily doped.

It is to be understood that the present invention is not limited to the illustrated herein and embodiments described above, but encompasses any and all variations falling within the scope of the appended claims. For example, the first semiconductor need not be of n-type, but rather can be a p-type semiconductor having a Fermi-level permits hole carriers in 78 moving into the second semiconductor 80 region. Furthermore, the sequence of the wider and the narrower energy band gap materials can be in reverse order than that illustrated in FIG. 13. In other words, the first semiconductor can be an un-doped semiconductor having a narrower energy band gap material than the second one, as long as the same effect on lowering sheet resistance is achieved. Additionally, although the energy band structure in FIG. 13 is illustrated in an asymmetrical structure, the concept provided herein can be easily extended to structures of symmetrical energy band. For example, the structure of FIG. 13 can comprise a heavily doped first semiconductor material having a wider energy band gap, an un-doped second semiconductor material having a narrower energy band gap relative to the first one, and a heavily doped third semiconductor material having a wider energy band gap similar to the first one. An alternate structure can comprise an un-doped first semiconductor material having a narrower energy band gap, a heavily doped second semiconductor material having a wider energy band gap relative to the first one, and an un-doped third semiconductor material having a narrower energy band gap similar to the first one. In both cases, the second material is sandwiched in between the first and the third material to form the symmetrical energy band. In either case, charge carriers in the wider band gap semiconductors will move into the narrower band gap ones. These carriers are confined in the un-doped regions. Therefore, during the conduction of these carriers, the sheet resistance can be extremely low due to negligible scattering between carriers and impurities.

Figure 14:
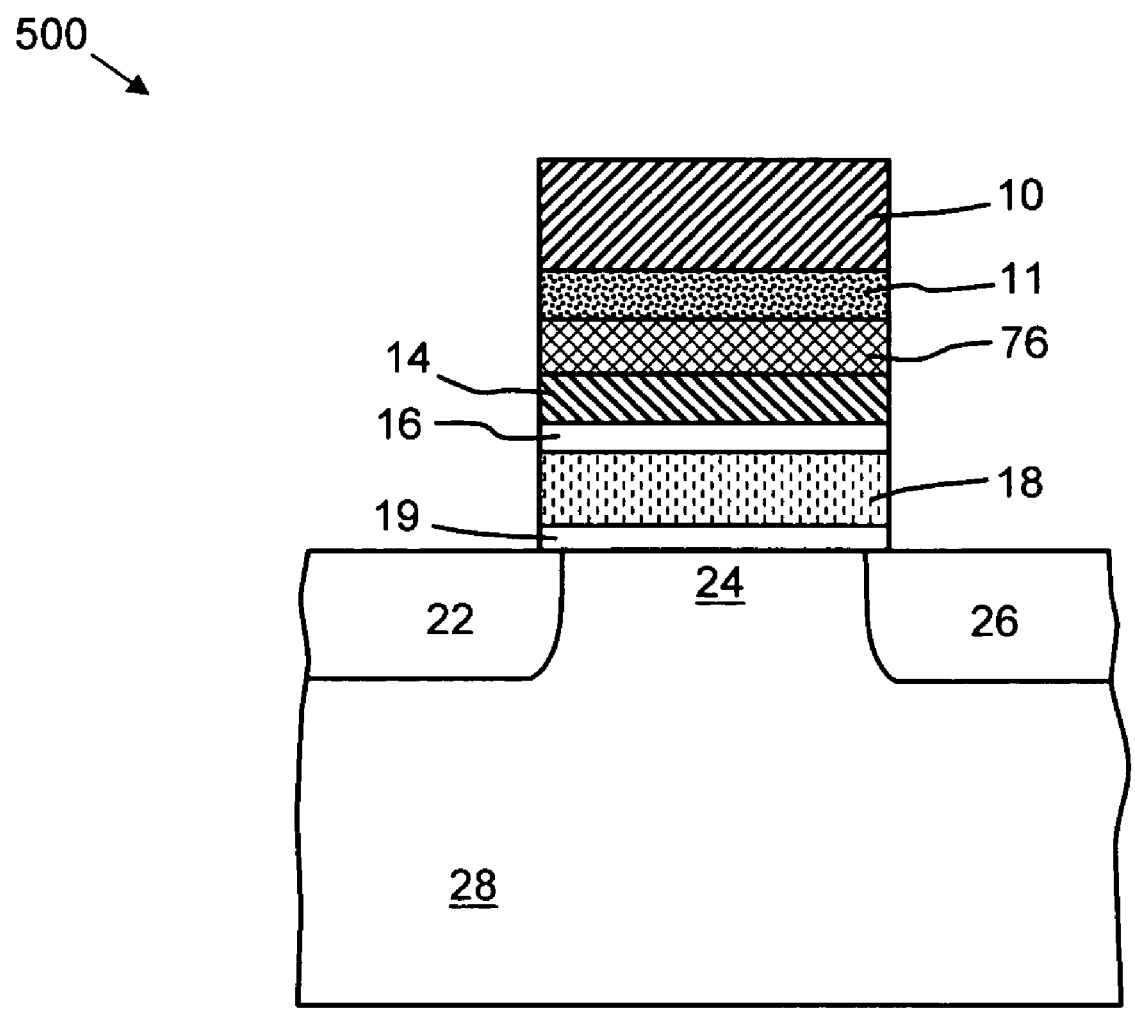
FIG. 14 is the cross sectional view of the cell structure for another embodiment of the present invention.

The energy band gap structures described in connection with FIG. 13 can be applied to memory cells of the present invention. FIG. 14 provides a cell 500 based on embodiment 400 and is shown as an illustration on the concept. The cell 500 is in all respects except one the same as that of FIG. 1A. The difference is that instead of BD 12 of the filter 9, the cell 500 is provided with a supplier gate (SG 76). Further, the cell 500 is different from the cell of prior art energy band structure. The SG 76 is disposed in between the TG 10 and the BG 14 regions. The SG 76 and BG 14 take advantage of the effects taught in the energy band gap structure of FIG. 13, with SG 76 corresponding to the first semiconductor 78 and BG 14 corresponding to the second semiconductor 80, thus can have advantages on lower sheet resistance for BG 14. SG 76 can be a heavily doped 4H-SiC layer, which has an energy band gap of about 3.2 eV, and BG 14 can be an un-doped polysilicon layer, which has an energy band gap of about 1.14 eV. Alternatively, SG 76 can be a heavily doped polysilicon layer, and BG 14 can be an un-doped polycrystalline Silicon-Germanium ("poly SiGe") layer, having a typical mole fraction for the germanium in the range of about 10% to about 50%. This results in the energy band gap of poly SiGe narrower than that of polysilicon in the range from about 0.05 eV to about 0.3 eV. The layer of SG 76 can be with a thickness in the range of about 30 Å to 300 Å and preferably in the range of about 50 Å to 100 Å. The thickness of BG 14 can be in the range of about 100 Å to 800 Å.

Figure 15:
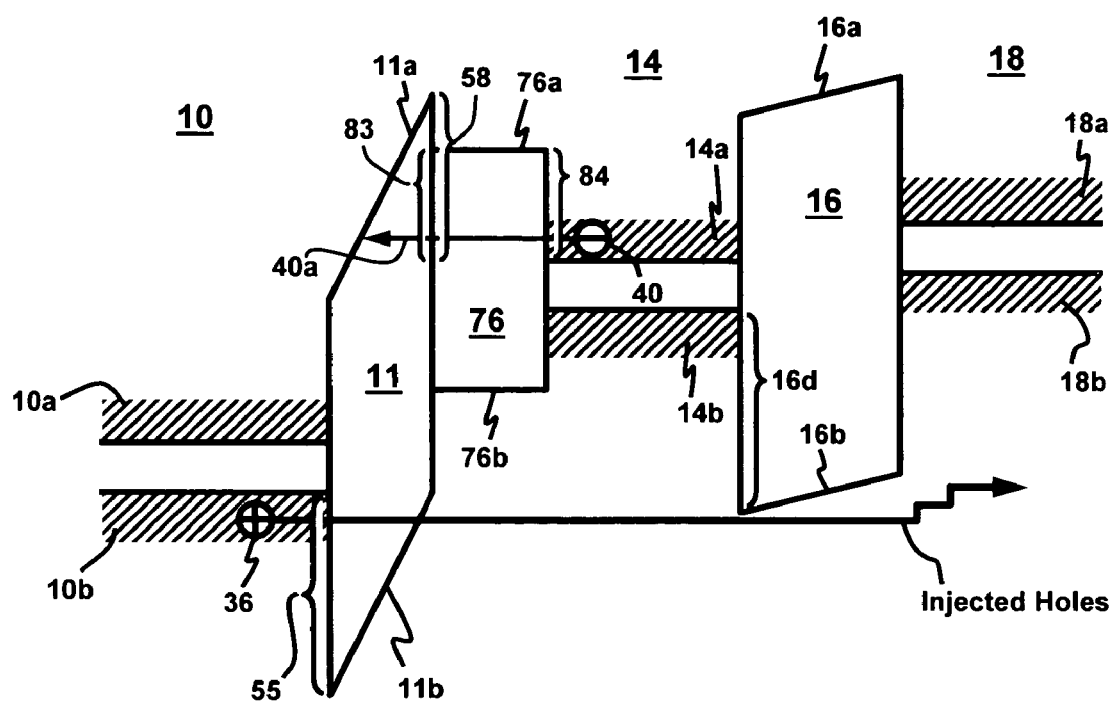
FIG. 15 is the energy band diagram of the structure of FIG. 14, illustrating various barrier heights under the erase operation, and further illustrating the barrier heights and the rectangular barrier structure for blocking the electron carriers from backward tunneling.

Other than the advantage on having a lower sheet resistance for BG 14, the energy band structure formed by the SG 76 and BG 14 regions further provides features on selectively tunneling one type of charge carriers (e.g. holes) while blocking the other type (e.g. electrons) from backward tunneling. This can be better captured by referring to FIG. 15, wherein the erase operation on injecting holes 36 is used as an illustration. Energy band diagram of FIG. 15 is similar to that of FIG. 3A except on physical parameters in the SG 76 region. In FIG. 15, there are shown conduction band 76a and valence band 76b of SG 76. The CE carriers 40 are from the donor impurities of SG 76 region due to the mechanism provided in FIG. 13. Further, there are shown barrier heights 83 ($\Delta\Phi_{CE\_GST}$), 84 ($\Delta\Phi_{CE\_GS}$), and a few barrier heights shown earlier in FIG. 3A. The barrier height 83 functions a similar role as that of the barrier height 59 ($\Delta\Phi CE_{GBT}$) in FIG. 3A. Likewise, the barrier height 84 functions a similar role as that of barrier height 57 in FIG. 3A. Different from the trapezoidal-shaped band structure in FIG. 3A, the barrier heights 83 and 84, and the conduction band 76a of SG 76 to a first order form a rectangular-shaped band structure as an electron barrier in SG 76 of FIG. 15. The rectangular barrier is to block CE carriers 40 in BG 14 from backward tunneling into TG 10 and can be a more effective barrier than the trapezoidal one in FIG. 3A. Therefore, the backward injected CE 40a can be significantly suppressed as compared to that in cell of prior art energy band. Furthermore, since SG 76 is a semiconductor, there can be negligible band bending in that region. To first order, this permits a main portion of the erase voltage appearing across TD 11 region. It thus preserves the effects on tunneling the wanted charges (i.e. holes 36) while the erase voltage is maintained at same level. As illustrated in FIG. 15, some of the holes 36 can tunnel through TD 11, and will be able to transport across the SG 76 and the BG 14 regions to reach the interface between BG 14 and RD 16. These holes eventually make their way over the barrier height 16d entering valence band 16b and subsequently get collected on FG 18 region in this erase operation.

Another advantage of the structure in FIG. 15 over the prior art is to do with the effect of the un-doped (or lightly doped) BG 14 region on the ballistic carrier transport. Due to the negligible impurity in BG 14, the scattering between the high energy carriers and the impurity is thus negligible. The high energy charge carriers thus can transport through BG 14 in ballistic transport mechanism at a much higher efficiency (number of charges injected compared to total number of charges supplied). Typically, the efficiency of the present cell structure can be about 2 to about 10 times higher than that of the prior art.

Similar illustration and effects can be extended to the program operation by updating barrier heights of the trapezoidal barriers in FIG. 7A to the barrier heights relevant to SG 76, in a similar procedure as illustrated in connection with the erase operation of FIG. 15. Therefore, the structure of TD/SG 11/76 further provides an electrically alterable filter feature which can filter out the unwanted carriers (e.g. the backward tunneling electrons) without affecting the transport of the wanted carriers (e.g. the forward tunneling holes). Additionally, the structure of SG/BG 76/14 provides a region having a low sheet resistance for ballistic carriers traversing there through.

Though not described, it should be obvious to those of ordinary skill in the art that the energy band structure provided in FIG. 13 can also be used in together with the filter structure 9 of TD 11 and BD 12 to form a structure of TG/TD/BD/SG/BG 10/11/12/76/14 in memory cell for effectively suppressing the parasitic capacitances while preserving the advantage on lower resistance for BG 14 and the advantage on blocking unwanted carriers. Additionally, it should be clear to those of ordinary skill in the art that the teaching of this disclosure can be applied to modify the shape of energy band structure of SG 76 and BG 14 regions to effectively decrease the sheet resistance of BG 14 regions and to block the parasitic charge carriers (electrons or holes) from backward tunneling. Furthermore, the SG 76 and BG 14 need not be a material with a uniform chemical element but can be a material with graded composition on its element (such as poly SiGe with grading the mole fraction of Ge). Moreover, the regions for SG 76 and BG 14 can be interchanged, and energy band gap of SG 76 need not be wider, but rather can be narrower than that of BG 14, as long as the narrower energy band gap material is un-doped or lightly doped such that the sheet resistance of the entire stack of BG 14 and SG 76 regions can be effectively lowered.

Finally, the read operation of the cells of the present invention is described next for completeness on cell operations. The read operation can best be described when cells are arranged in a rectangular array of rows and columns, wherein a plurality of cells in accordance with the present invention are constructed in NOR or NAND architecture well-known in the art. The read operation can be illustrated with cells constructed with source 22, drain 26, channel 24 being n-type, and body 28 being p-type. To read the memory cells, a ground potential is applied to its source region 22. A read voltage of approximately +1 volt is applied to its drain region 26 and approximately 2.5 volts (depending upon the power supply voltage of the cell) is applied to its BG 14. Other regions (i.e. TG 10 and body 28 regions) are at ground potential. If FG 18 is positively charged (i.e. FG is discharged of electrons), then the channel region 24 is turned on. Thus, an electrical current will flow from the source region 22 to the drain region 26. This would be the "1" state.

On the other hand, if FG 18 is negatively charged, the channel region 24 is either weakly turned on or is entirely shut off. Even when BG 14 and the drain region 26 are raised to the read potential, little or no current will flow through channel region 24. In this case, either the current is very small compared to that of the "1" state or there is no current at all. In this manner, the memory cell is sensed to be programmed at the "0" state. Ground potential is applied to the source regions 22, drain regions 26, and BG 14 for cells in non-selected columns and rows so only the selected memory cell is read. For both selected and non-selected memory cells, ground potential is applied to the body region 28.

It should be clear to those of ordinary skill in the art that the teachings of this disclosure can be applied to modify the energy band structure through which the effects resulting in the above advantages can be achieved.

The memory cell can be formed in an array with peripheral circuitry including conventional row address decoding circuitry, column address decoding circuitry, sense amplifier circuitry, output buffer circuitry and input buffer circuitry, which are well known in the art.

The cell operation and the memory cell architecture of the present invention is advantageous because it does not require high voltages (e.g. 2.5V or higher) for cell operations, and hence remove requirements on high-voltage infrastructures and avoid issues therein. Another important feature of the present invention is the provision of BD 12, BM 73, BNC 74, SG 76, in embodiments 100, 200, 300, and 500, respectively. The provision allows a charge injection scheme where electrons or holes can be emanated from a tunneling gate 10 above the silicon substrate and are transported along a trajectory aiming at floating gate 18 without suffering the issues such as dielectric breakdown, cell disturbs (by program or by erase).

The injection scheme illustrated in the present invention provides a main advantage over conventional art (for example, U.S. Pat. Nos. 5,780,341 and 6,747,310 B2). First, the program efficiency is greatly enhanced by "aiming" the ballistic charge carriers at the floating gate 18. In conventional programming schemes, the electrons transport along the channel region in a path parallel to the floating gate, where a relatively small number of the electrons become heated and are injected onto the floating gate. The program efficiency (number of charges injected compared to total number of charges supplied) is estimated at about $\frac{1}{1000}$ to about $\frac{1}{1,000,000}$. However, in the present invention, high energy carriers are 'aimed' directly at the floating gate, the program efficiency is estimated to be closer to $\frac{1}{100}$, where almost most of the charges are injected onto the floating gate. Secondly, through out the cell operations, the highest voltage (e.g. 2.5V) appears only to regions above the silicon surface level (such as BG 14 and TG 10). In other words, none of the regions under the silicon surface where metallurgical junctions are involved (e.g. source regions 22 and drain regions 26) will ever experience the highest voltage provided in the cell operations. This is because in the present invention, both source 22 and drain 26 regions have a principle role on the read operation, which is performed at a relative low voltage. Though the two regions involved in program and erase operations, their role are primarily to couple a small amount of voltage (~0 to 2V) to the floating gate 18, and have no involvement whatsoever on high voltage effect such as generating or supplying high energy carriers.

Being able to keep regions with metallurgical junctions at a relative low voltage through out the cell operations provides a unique feature to the present invention. The feature brings several additional advantages. First, the scaling constraint on cell height (defined as the spacing between two adjacent cells along the channel direction) is removed. Therefore further scaling on cell dimension using more aggressive design rule is possible. Memory cell size is reduced by as much as 50% because of the low voltage at drain 26. Cell areas of approximately 0.07 µM and 0.033 µm² can be achieved by the present invention using 130 nm and 90 nm technology generations, respectively, with further reduction possible. Secondly, the hot carrier effect associated with metallurgical junction fields of drain 26 and source 22 and its degradation and damage to the insulator 19 (see FIG. 1A) adjacent thereto are avoided. This is in a clear contrast to the damage effect in conventional non-volatile memory, where cell programming is done by heating up electrons through applying a high voltage at one of the junctions, which inevitably introduces high field across the insulator adjacent to the floating gate and results in damage therein. Furthermore, due to the relatively smaller difference on voltage between the floating gate 18 and its surrounding regions (e.g. drain 26), the field stress effect on the insulator 19 therebetween are largely suppressed. This advantage is of particular importance to charge retention and reliability for nonvolatile memory cells.

What is claimed is:

1. A nonvolatile memory cell, comprising:
a body of a semiconductor material having a first conductivity type;
first and second spaced-apart regions formed in the body and having a second conductivity type, with a channel region of the body defined between the first and second spaced-apart regions;
a charge storage layer disposed over and insulated from the channel region;
a ballistic gate disposed over and insulated from the charge storage layer; and
a tunneling gate disposed over and insulated from the ballistic gate by a charge filter,
wherein the charge filter (i) permits transporting of charge carriers of one polarity type from the tunneling gate through the ballistic gate to the charge storage layer and (ii) blocks transporting of charge carriers of an opposite polarity type from the ballistic gate to the tunneling gate,
wherein the charge filter comprises:
a first dielectric disposed adjacent to the ballistic gate; and
a second dielectric disposed adjacent to the first dielectric, wherein the first dielectric has an energy band gap narrower than an energy band gap of the second dielectric, and
wherein the tunneling gate comprises a p+ semiconductor and the ballistic gate comprises an n+ semiconductor having an energy band gap narrower than an energy band gap of the first dielectric.

2. The memory cell of claim 1, wherein a product of a dielectric constant of the first dielectric and a thickness of the second dielectric is substantially greater than a product of a dielectric constant of the second dielectric and a thickness of the first dielectric.

3. The memory cell of claim 1, wherein the second dielectric comprises oxide, and the first dielectric comprises material selected from the group consisting of nitride, oxynitride, $Al_2O_3$, $HfO_2$, $TiO_2$, $ZrO_2$, $Ta_2O_5$, and alloys formed thereof.

4. The memory cell of claim 1, wherein the second dielectric comprises oxynitride, and the first dielectric comprises material selected from the group consisting of nitride, $Al_2O_3$, $HfO_2$, $TiO_2$, $ZrO_2$, $Ta_2O_5$, and alloys formed thereof.

5. The memory cell of claim 1, wherein the ballistic gate has a Fermi level in a flat band condition that lies nominally in the middle of the energy band gap of the first dielectric.

6. The memory cell of claim 1, wherein the tunneling gate emits hole carriers when positively biased with respect to the ballistic gate, and emits electron carriers when negatively biased with respect to the ballistic gate.

7. The memory cell of claim 1, wherein the ballistic gate comprises material selected from the group consisting of Pt, Au, W, Mo, Ru, Ta, TaN, TiN, n+ polysilicon, p+ polysilicon, n+ poly SiGe and p+ poly SiGe.

8. The memory cell of claim 1, wherein the charge storage layer comprises polysilicon.

9. The memory cell of claim 1, wherein the charge storage layer comprises a dielectric having a plurality of charge storing traps.

* * * * *